(12) United States Patent
Okuno et al.

(10) Patent No.: US 7,800,181 B2
(45) Date of Patent: Sep. 21, 2010

(54) SEMICONDUCTOR DEVICE AND METHOD FOR FABRICATING THE SAME

(75) Inventors: Yasutoshi Okuno, Kyoto (JP); Michikazu Matsumoto, Kyoto (JP); Masafumi Kubota, Osaka (JP); Seiji Ueda, Shiga (JP); Hiroshi Iwai, Kanagawa (JP); Kazuo Tsutsui, Kanagawa (JP); Kuniyuki Kakushima, Kanagawa (JP)

(73) Assignee: Panasonic Corporation, Osaka (JP)

( * ) Notice: Subject to any disclaimer, the term of this patent is extended or adjusted under 35 U.S.C. 154(b) by 422 days.

(21) Appl. No.: 11/582,556

(22) Filed: Oct. 18, 2006

(65) Prior Publication Data

US 2007/0093047 A1    Apr. 26, 2007

(30) Foreign Application Priority Data

Oct. 19, 2005  (JP) .............................. 2005-304753
Dec. 9, 2005   (JP) .............................. 2005-355808

(51) Int. Cl.
      *H01L 29/78*        (2006.01)
(52) U.S. Cl. ................. 257/369; 257/411; 257/E29.255
(58) Field of Classification Search ......... 438/582–583, 438/663–664, 199–200; 257/369, 411, 412
      See application file for complete search history.

(56) References Cited

U.S. PATENT DOCUMENTS

| 6,689,688 | B2 | 2/2004 | Besser et al. |
| 2005/0045965 | A1* | 3/2005 | Lin et al. .................... 257/384 |
| 2005/0110070 | A1* | 5/2005 | Omura ....................... 257/311 |
| 2007/0090417 | A1* | 4/2007 | Kudo ......................... 257/288 |
| 2007/0138580 | A1* | 6/2007 | Takahashi et al. .......... 257/412 |

OTHER PUBLICATIONS

Min-Joo Kim et al., "High Thermal Stability of Ni Monosilicide from Ni-Ta Alloy Films on Si(100)," *Electrochemical and Solid-State Letters*, 6 (10) G122-G125 (2003), The Electrochemical Society, Inc.

R. Xiang et al., "Formation of Ni Silicide by Addition of Hf," Tokyo Institute of Technology, Preliminary Material for 65th Annual Meeting of Japanese Society of Applied Physics, p. 708, Sep. 1 to 4, Autumn in 2004.

Young-Woo Ok et al., "Effect of a Mo Interlayer on the Electrical and Structural Properties of Nickel Silicides," *Journal of The Electrochemical Society*, 150 (7) G385-G388 (2003), The Electrochemical Society, Inc.

(Continued)

*Primary Examiner*—Phat X Cao
*Assistant Examiner*—Nga Doan
(74) *Attorney, Agent, or Firm*—McDermott Will & Emery LLP

(57) ABSTRACT

A gate electrode is formed on a semiconductor substrate containing silicon, then source/drain regions are formed in regions of the semiconductor substrate located to both sides of the gate electrode, and then a nickel alloy silicide layer is formed on at least either the gate electrode or the source/drain regions. In the step of forming the nickel alloy silicide layer, a nickel alloy film and a nickel film are sequentially deposited on the semiconductor substrate and thereafter subjected to heat treatment.

9 Claims, 19 Drawing Sheets

OTHER PUBLICATIONS

Jer-Shen Maa, "Effect of interlayer on thermal stability of nickel silicide," J. Vac. Sci. Technol. A 19(4), Jul./Aug. 2001, 2001 American Vacuum Society.

D. Mangelinck et al., "Enhancement of thermal stability of NiSi films on (100)Si and (111)Si by Pt addition," Applied Physics Letters, Sep. 20, 1999, pp. 1736-1738, vol. 75, No. 12, 1999 American Institute of Physics.

C. Kothandaraman et al., "Electrically Programmable Fuse (eFUSE) Using Electromigration in Silicides," IEEE Electron Device Letters, Sep. 2002, pp. 523-525 vol. 23, No. 9, 2002 IEEE.

P. Gas and F.M. D'Heurle, "Kinetics of formation of TM silicide thin films: self-diffusion," Properties of Metal Silicides, Jan. 1995, pp. 279-292.

F.F. Zhao et al., "Thermal stability study of NiSi and $NiSi_2$ thin films," Microelectric Engineering 71 (2004) pp. 104-111.

* cited by examiner

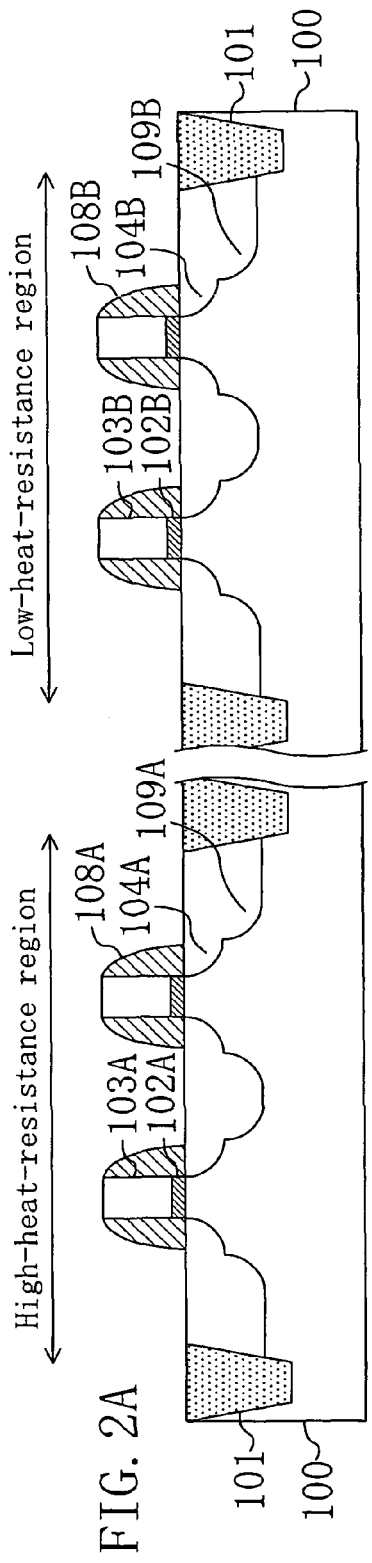
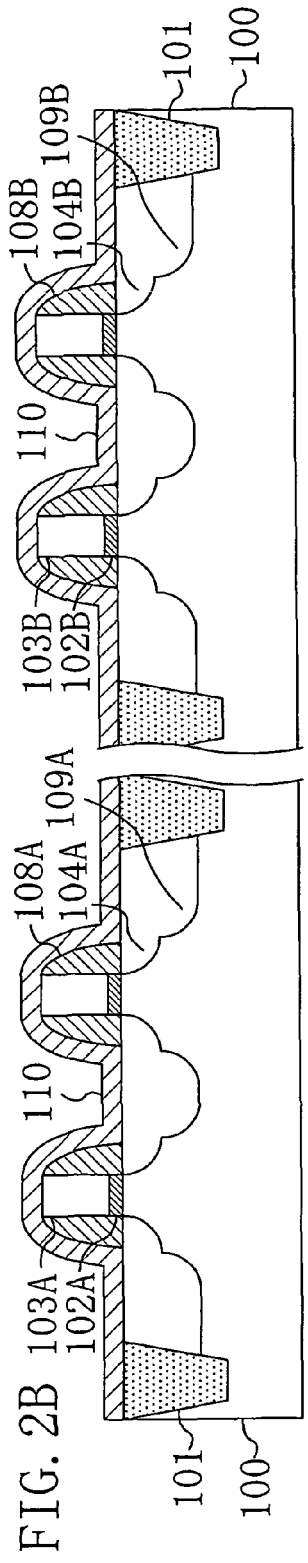
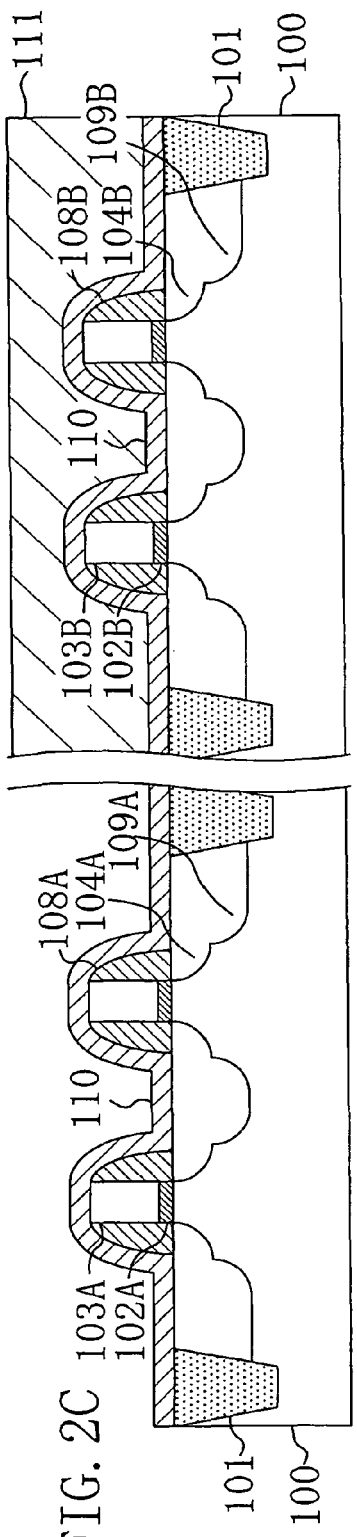

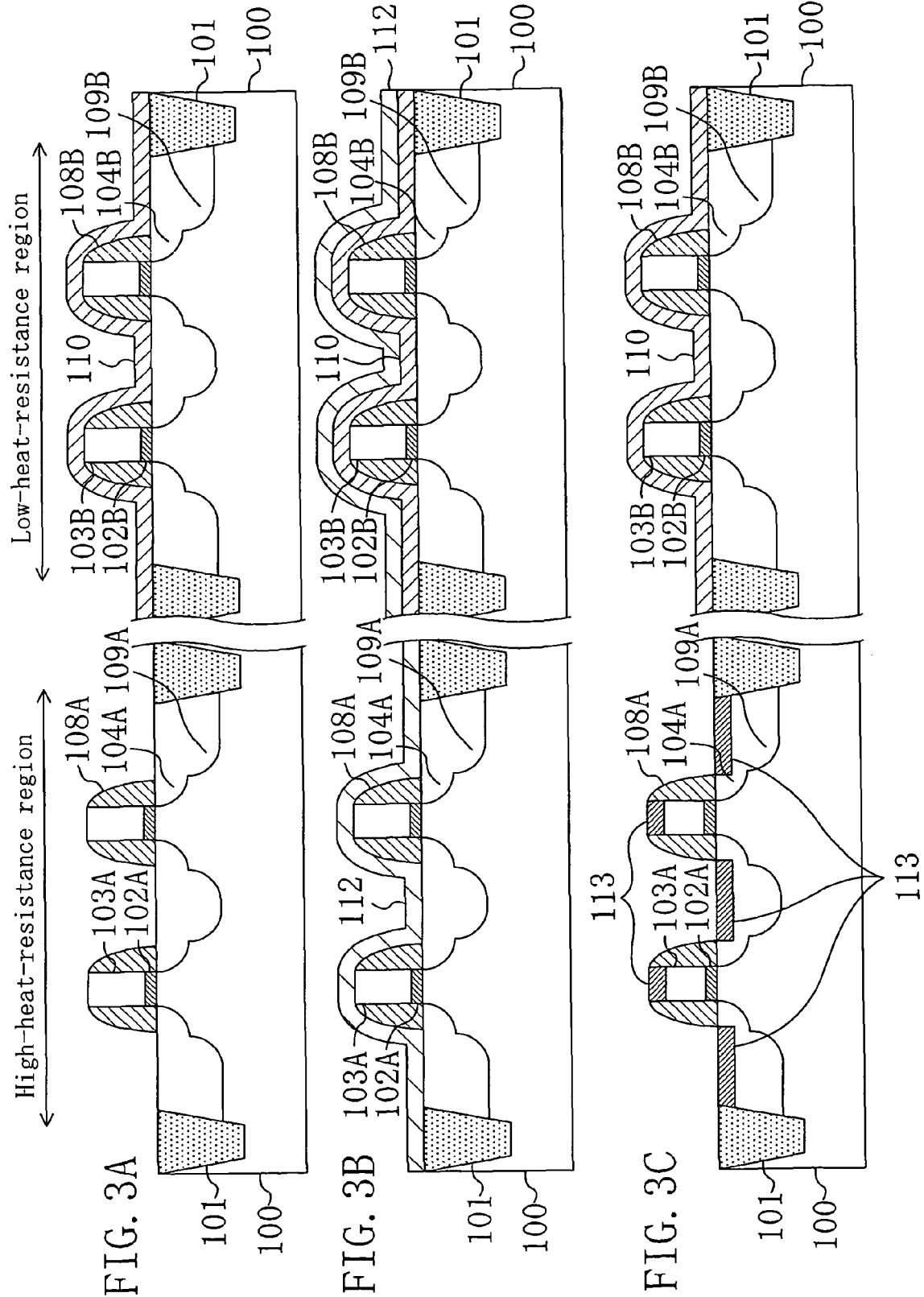

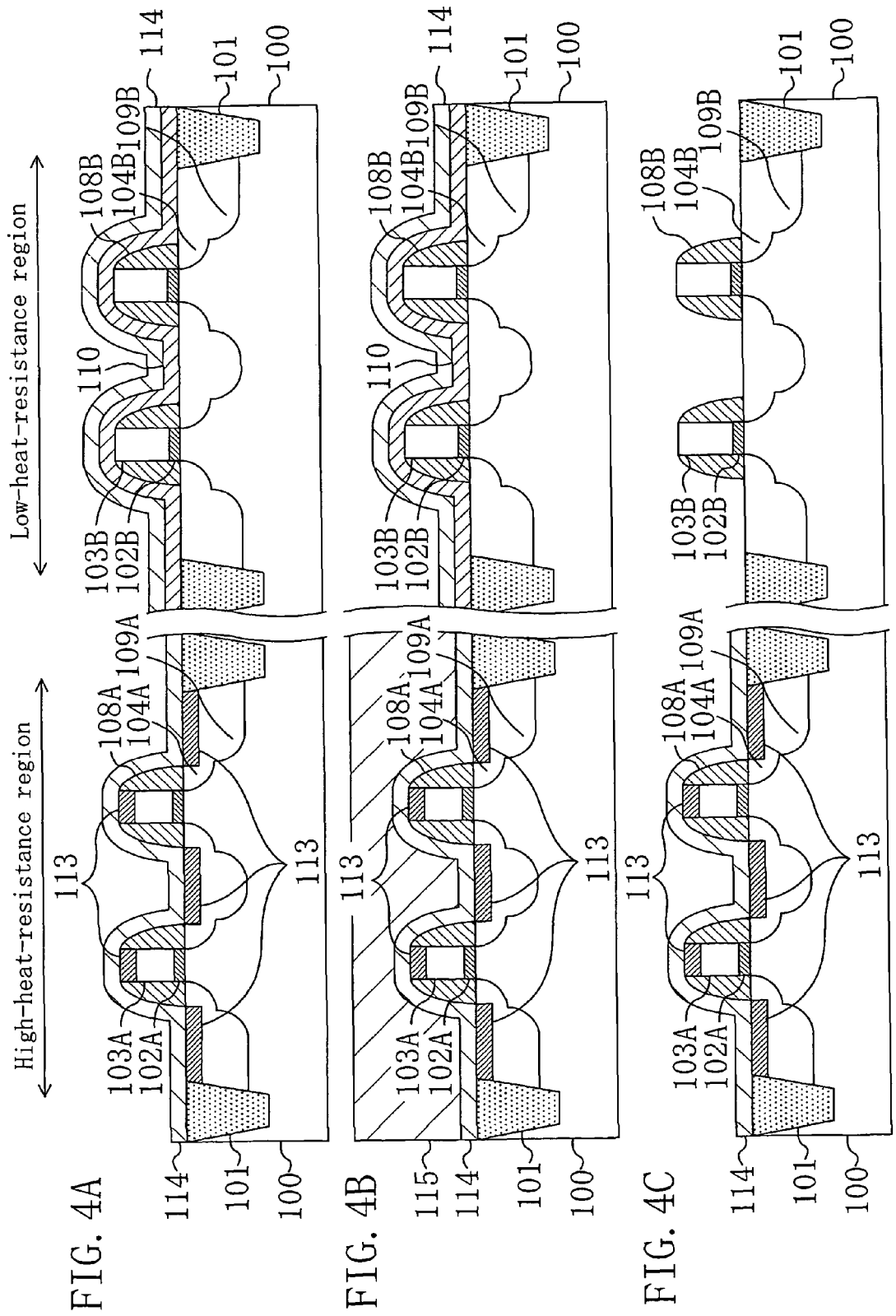

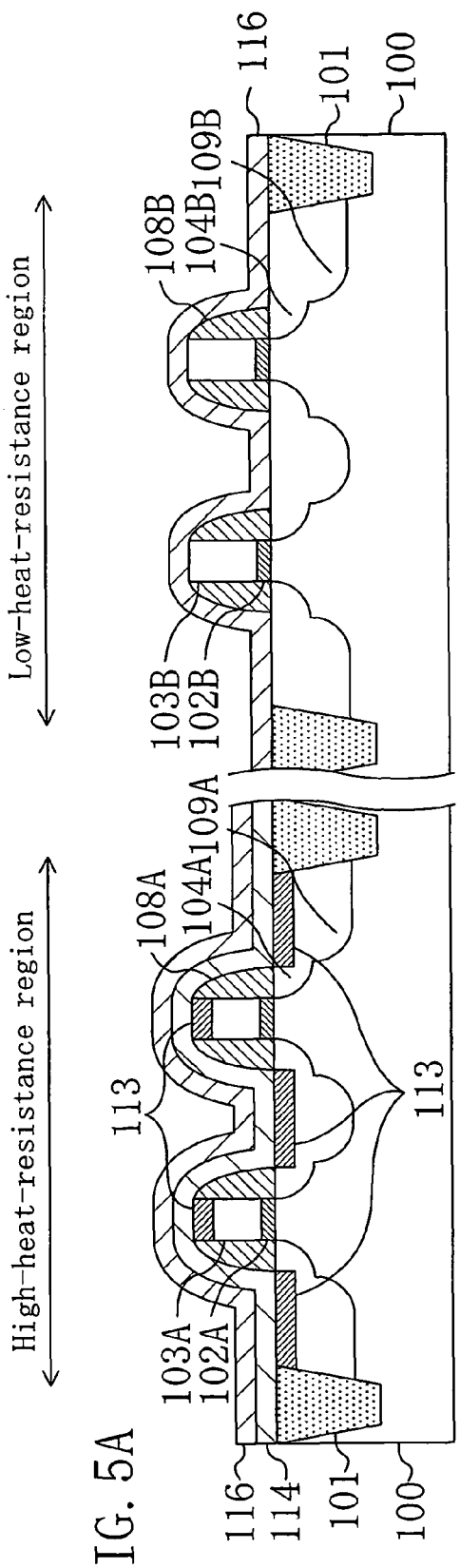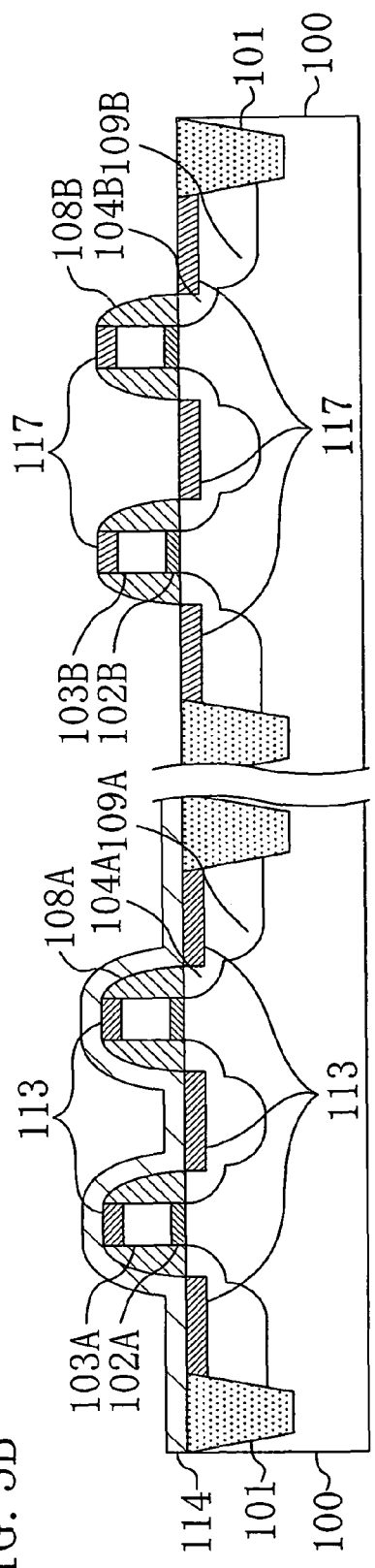

FIG. 10

| Element | Silicidation temperature(°C) | Silicide composition |
|---|---|---|
| Nickel(Ni) | 200—325 | Ni$_2$Si |
| Vanadium(V) | 730—820 | V$_3$Si |
| Molybdenum(Mo) | 1500—1700 | Mo$_3$Si |
| Cobalt(Co) | 350—500 | Co$_2$Si |
| Niobium(Nb) | 1140—1465 | Nb$_5$Si$_3$ |
| Tantalum(Ta) | 1040—1464 | Ta$_5$Si$_3$ |
| Tungsten(W) | 1350—1870 | W$_5$Si$_3$ |
| Zirconium(Zr) | 670—730 | Zr$_5$Si$_4$ |
| Nickel(Ni) | 275—400 | NiSi |
| Manganese(Mn) | 425—500 | MnSi |
| Iron(Fe) | 450—525 | FeSi |
| Iridium(Ir) | 400-550 | IrSi |
| Ruthenium(Ru) | 400-475 | RuSi |
| Rhodium(Rh) | 400-475 | RhSi |
| Hafnium(Hf) | 525—650 | HfSi |

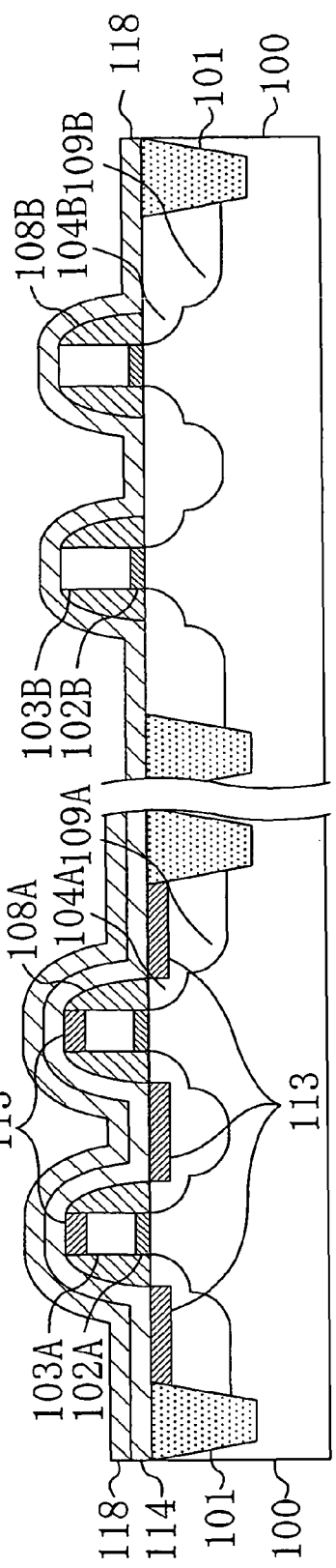
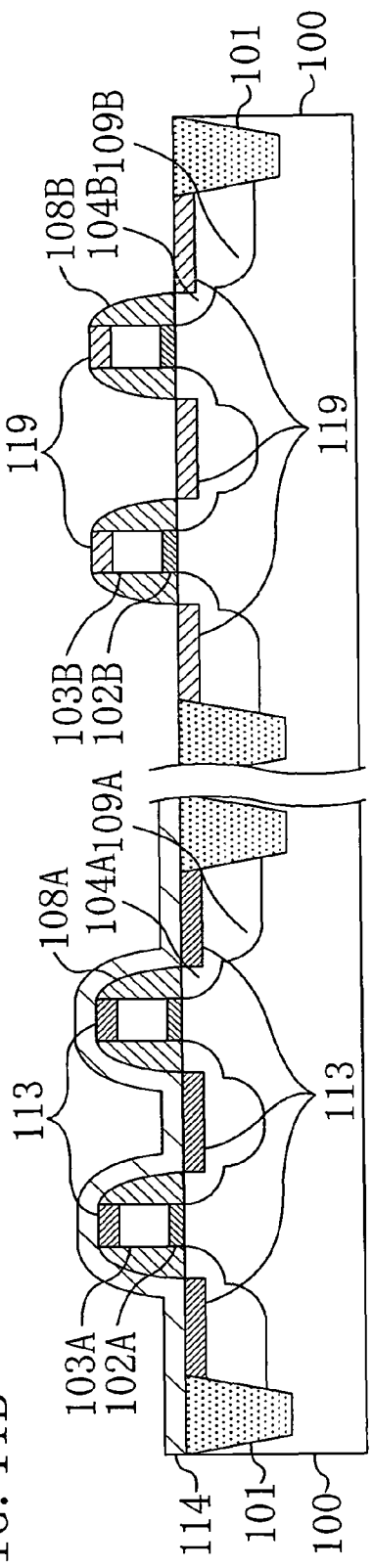

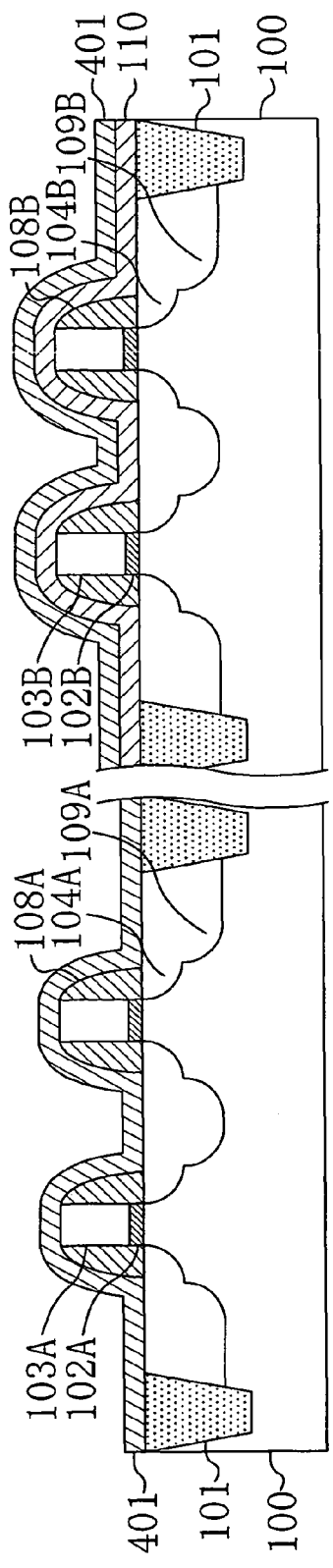
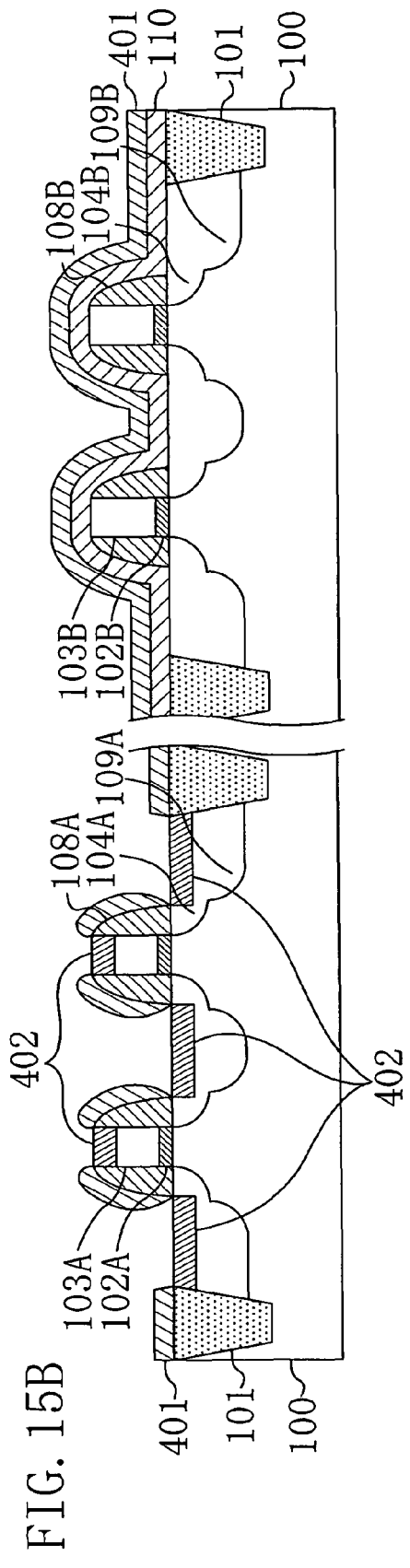
FIG. 15A
FIG. 15B

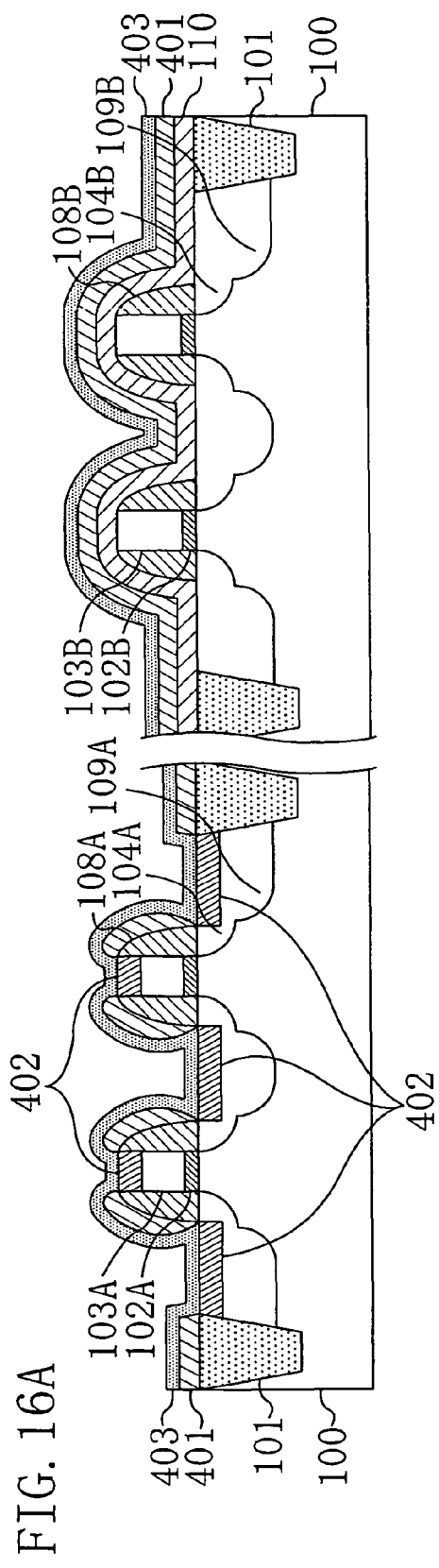
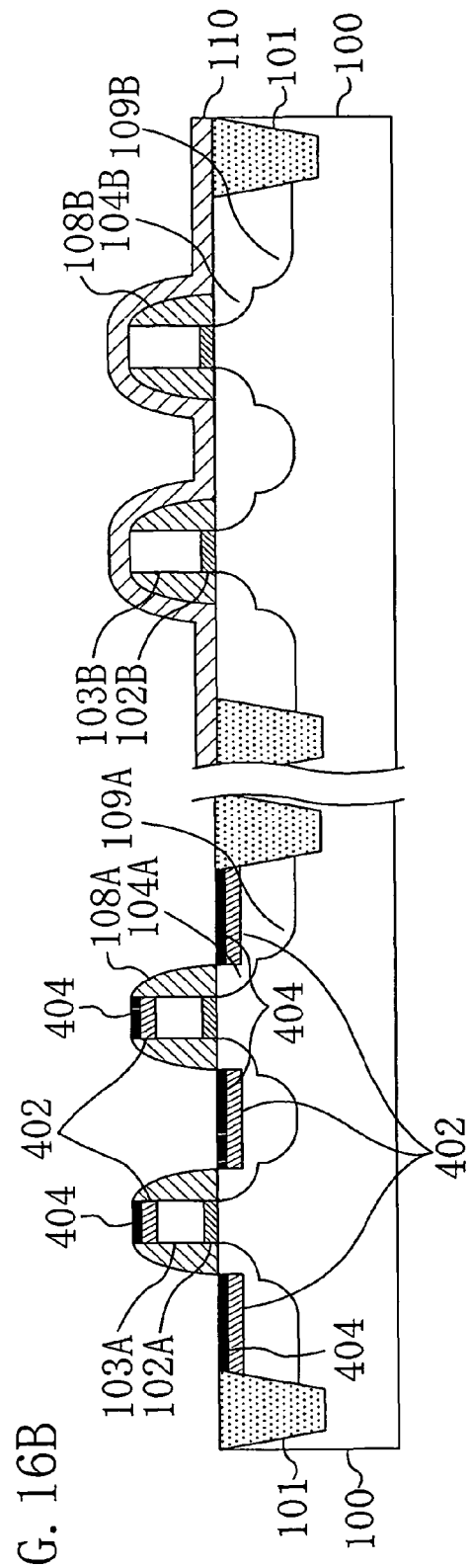

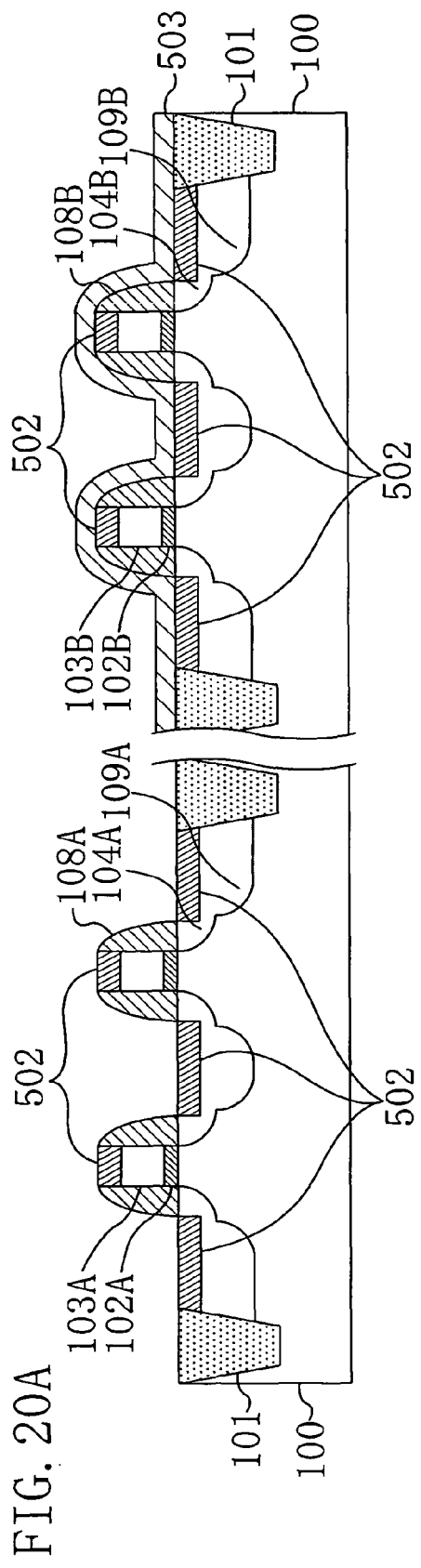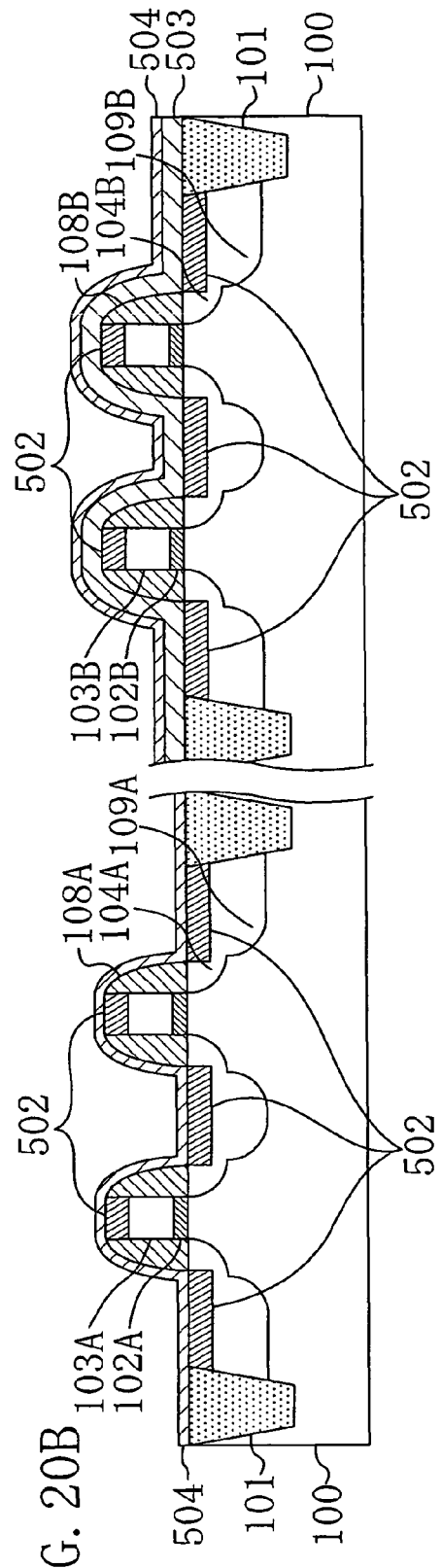

SEMICONDUCTOR DEVICE AND METHOD FOR FABRICATING THE SAME

BACKGROUND OF THE INVENTION (1) Field of the Invention

The present invention relates to semiconductor devices and methods for fabricating the same, and more particularly relates to the structures of silicide layers and formation methods for the same.

(2) Description of Related Art

In general metal oxide semiconductor (MOS) transistors, reduction of parasitic resistance such as contact resistance and wiring resistance is important in increasing operation speed. The reduction of parasitic resistance in such transistors is generally achieved by siliciding upper portions of source/drain regions and upper portions of gate electrodes.

To increase the integration degree of a large-scale semiconductor integrated (LSI) circuit device, reduction of the vertical size as well as the horizontal size is needed. A method in which the junction depth of a doped layer to be source/drain regions is reduced is used as one of methods for reducing the vertical size,. However, if the thickness of the doped layer in the semiconductor substrate is small, there arises a problem in which the resistance of the doped layer increases so that the operation speed of the semiconductor device decreases. To prevent this decrease, it is effective to reduce the source/drain resistance by using a structure in which a metal silicide layer is formed in the surface of the doped layer. The following method has conventionally been used as a method for forming metal silicide layers: A metal film is deposited to cover a silicon substrate and polysilicon that will be a gate electrode and subjected to heat treatment so that metal and silicon react with each other to form silicide in upper portions of source/drain regions and an upper portion of the gate electrode. In a case where impurity diffusion layers forming source/drain regions are allowed to have a shallow junction structure, a material capable of reducing the amount of silicon consumed during silicidation needs to be used as a material for silicide layers.

A silicide formation technique using, as a material capable of reducing the amount of silicon consumed, nickel (Ni) that forms low-resistance monosilicide has been developed.

However, it has been known that $NiSi_2$, which is a disilicide phase of Ni silicide, has a lattice constant fairly close to that of silicon and forms an inverted-pyramidal interface by subsequent high-temperature heat treatment or under inappropriate process conditions. A method for forming an alloyed silicide has been proposed as a method for forming Ni silicide with stability by enhancing resistance (heat resistance) to subsequent high-temperature heat treatment (see, for example, patent literature 1: U.S. Pat. No. 6,689,688). In this patent, examples of elements providing the effect of stabilizing NiSi, which is a low-resistance monosilicide phase, by being added to NiSi include Ge, Ti, Re, Ta, N, V, Ir, Cr and Zr (see, for example, non-patent literature 1: Min-Joo Kim, Hyo-Jick Choi, Dae-Hong Ko, Ja-Hum Ku, Siyoung Choi, Kazuyuki Fujihara, and Cheol-Woong Yang, "High Thermal Stability of Ni Monosilicide from Ni—Ta Alloy Films on Si(100)", Electrochem. Solid-State Lett. 6, 2003, G122). In addition, it is suggested in a report that Hf, which is an element exhibiting physical/chemical properties similar to those of Zr, also has a similar effect (see, for example, non-patent literature 2: R. Xiang (in Tokyo institute of Technology) et al., "Formation of Ni Silicide by Addition of Hf", Preliminary Material for 65th Annual Meeting of Japanese Society of Applied Physics, P. 708, Sep. 1 to 4, Autumn in 2004 (Lecture No. 2P-M-10)). It is also suggested in other reports that elements such as Mo, Ir, Co and Pt have similar advantages (see, for example, non-patent literature 3: Young-Woo Ok, Chel-Jong Choi, and Tae-Yeon Seong, "Effect of a Mo Interlayer on the Electrical and Structural Properties of Nickel Silicides", J. Electrochem. Soc. 150, 2003, G385, non-patent literature 4: Jer-shen Maa, Yoshi Ono, Douglas J. Tweet, Fengyan Zhang, and Sheng Teng Hsu, "Effect of interlayer on thermal stability of nickel silicide", J. Vac. Sci. Technol. A 19, 2001, pp. 1595, and non-patent literature 5: D. Mangelinck, J. Y. Dai, J. S. Pan, and S. K. Lahiri, "Enhancement of thermal stability of NiSi films on (100)Si and (111)Si by Pt addition", Appl. Phys. Lett., 1999, vol.75, num.12, pp. 1736).

SUMMARY OF THE INVENTION

However, the heat resistance (heat-resistant temperature) demanded for Ni silicide varies according to the process temperature (back-end thermal budget) after silicide formation in fabrication of a target semiconductor device and other factors. In view of the above, it is desired to not only enhance but also further optimize the heat resistance of Ni silicide.

A so-called eFUSE technology has been proposed in which internal circuits are switched on or off by cutting fine gate lines using Joule heat generated by the passage of current through the fine gate lines (see, for example, non-patent literature 6: Kothandaraman C.; Iyer, S.K.; Iyer, s.s.; "Electrically programmable fuse (eFUSE) using electromigration in silicides", Electron Device Letters, IEEE 23, 2002, p.523-525). However, in a case where in an eFUSE the heat resistance of the silicided fine line is extremely high, there is a high possibility that the current needed to cut the fine line will become extremely large. As a result, circuits around the eFUSE are quite likely to be adversely affected.

In view of the above, the necessary heat resistance varies according to the type of circuit. Therefore, it is significant to form Ni silicide having desired heat resistance on a desired region of a semiconductor device.

A method in which a Ni silicide alloy having a desired composition is formed using an alloy target has been proposed as a method for controlling the heat resistance of silicide. In this method, a Ni alloy is deposited on a substrate by sputtering using a Ni alloy target containing an alloyed metal providing desired heat resistance, and then the deposited Ni alloy is subjected to heat treatment, thereby forming a Ni silicide alloy.

However, in the known method, many experiments for optimization have been needed to provide desired heat resistance. Therefore, the heat resistance has not been able to be optimized with ease. Furthermore, it has been difficult to form two or more types of suicides having different heat-resistant properties on arbitrary regions of the substrate. The reason for this is that sputtering needs to be carried out using a plurality of different Ni alloy targets.

In view of the above, an object of the present invention is to optimize the heat-resistant properties of Ni suicides with ease and allow a plurality of Ni silicides having different heat resistant properties to be formed on desired regions of a device.

In order to achieve the above object, the present inventors arrived at the idea of easily optimizing the heat resistance of an alloyed silicide by the formation of a Ni alloy as an interface layer.

To be specific, a method for fabricating a semiconductor device according to a first aspect of the present invention includes the steps of: forming a gate electrode on a semiconductor substrate containing silicon; forming source/drain regions in regions of the semiconductor substrate located to both sides of the gate electrode; and forming a nickel alloy silicide layer on at least either the gate electrode or the source/drain regions. In the step of forming the nickel alloy silicide layer, a nickel alloy film and a nickel film are sequentially deposited on the semiconductor substrate and then subjected to heat treatment.

According to the method of the first aspect of the present invention, the temperature at which a silicide reaction occurs (hereinafter, referred to as "silicidation temperature") is increased because of the nickel alloy film. This permits an increase in the heat-resistant temperature of the nickel alloy silicide layer proportional to the above-mentioned silicidation temperature. More particularly, the upper nickel film starts being silicided only after the lower nickel alloy film starts being silicided. Therefore, the silicidation temperature of the whole layered film of the nickel alloy film and the nickel film becomes higher than that of a Ni layer alone. The silicidation temperature can be controlled by the type of an alloyed metal in a nickel alloy film and the Ni content therein. The alloyed metal in the nickel alloy film means a metal forming a nickel alloy and hereinafter has the same meaning. In view of the above, the heat-resistant properties (heat-resistant temperatures) of the nickel alloy silicide layers can be simply optimized.

The heat-resistant temperature (heat resistance) of the silicide layer means the maximum temperature at which the silicide layer is changed in its electrical resistance, i.e., the temperature at which the silicide layer is agglomerated.

According to the method of the first aspect of the present invention, the Ni content in the nickel alloy silicide layer can be easily adjusted by the ratio in thickness between the nickel alloy film and the nickel film. More specifically, a relative reduction in the thickness of the nickel alloy film allows the formation of a nickel alloy silicide layer having a high Ni content, i.e., a low-electrical-resistance nickel alloy silicide layer, while achieving desired heat resistance. In view of the above, for example, a high-heat-resistance and low-electrical-resistance nickel alloy silicide layer is achieved.

Furthermore, according to the method of the first aspect of the present invention, two or more types of nickel alloy silicide layers having different heat-resistant properties can be formed on arbitrary regions of a substrate by appropriately selecting the type of an alloyed metal in the nickel alloy film and the Ni content therein. In other words, two or more types of nickel alloy silicide layers having different heat-resistant properties can be formed on arbitrary regions of the substrate without preparing a plurality of targets to be sputtered corresponding to desired heat resistant properties.

In the method of the first aspect of the present invention, an alloyed metal contained in the nickel alloy film is preferably a metal causing a silicide reaction to occur at a higher temperature than Ni.

This increases the silicidation temperature of the whole layered film of the nickel alloy film and the nickel film with reliability.

A method for fabricating a semiconductor device according to a second aspect of the present invention includes the steps of: forming a first gate electrode on a first region of a semiconductor substrate containing silicon and forming a second gate electrode on a second region of the semiconductor substrate; forming first source/drain regions in regions of the semiconductor substrate located to both sides of the first gate electrode and forming second source/drain regions in regions of the semiconductor substrate located to both sides of the second gate electrode; forming a first nickel alloy silicide layer on at least either the first gate electrode or the first source/drain regions; and forming a second nickel alloy silicide layer on at least either the second gate electrode or the second source/drain regions. In the step of forming the first nickel alloy silicide layer, a first nickel alloy film and a first nickel film are sequentially deposited on the first region and then subjected to heat treatment. In the step of forming the second nickel alloy silicide layer, a second nickel alloy film and a second nickel film are sequentially deposited on the second region and then subjected to heat treatment. The first nickel alloy film has at least either a different type of alloyed metal or a different nickel content from the second nickel alloy film.

In other words, in the method of the second aspect of the present invention, the first nickel alloy film whose composition is optimized to provide necessary heat resistance for elements or the like formed on the first region and the first nickel film are sequentially stacked on the substrate, and then the stacked layers are subjected to heat treatment, thereby forming a first nickel alloy silicide layer. In addition, the second nickel alloy film whose composition is optimized to provide necessary heat resistance for elements or the like formed on the second region and the second nickel film are sequentially stacked on the substrate, and then the stacked layers are subjected to heat treatment, thereby forming a second nickel alloy silicide layer.

According to the method of the second aspect of the present invention, since the method of the first aspect of the present invention is applied to the method of the second aspect, the heat resistance of the nickel alloy silicide layer can be simply optimized. In addition, two types of nickel alloy silicide layers having different heat-resistant properties can be formed on arbitrary regions of the substrate.

It is needless to say that three or more types of nickel alloy silicide layers having different heat-resistant properties may be formed on arbitrary regions of the substrate by applying the methods of the first and second aspects of the present invention.

In the method of the second aspect, alloyed metals contained in the first nickel alloy film and the second nickel alloy film are preferably metals causing a silicide reaction to occur at a higher temperature than Ni.

This increases the silicidation temperature of the whole layered film of the nickel alloy film and the nickel film.

A semiconductor device according to a third aspect of the present invention includes two or more nickel alloy silicide layers having at least either different nickel contents or different types of alloyed metals.

In other words, the semiconductor device of the third aspect of the present invention is a semiconductor device fabricated by the method of the second aspect of the present invention. In the semiconductor device of the third aspect of the present invention, like the method of the second aspect of the present invention, the alloyed metals contained in the nickel alloy silicide layers are preferably metals causing a silicide reaction to occur at a higher temperature than Ni.

A semiconductor device according to a fourth aspect of the present invention includes a CMOS portion and an eFUSE portion both on a semiconductor substrate. A first nickel alloy silicide layer is used for the CMOS portion, a second nickel alloy silicide layer is used for the eFUSE portion, and the heat-resistant temperature of the first nickel alloy silicide layer is higher than that of the second nickel alloy silicide layer.

According to the semiconductor device of the fourth aspect of the present invention, since the heat resistance of the nickel alloy silicide layer for the eFUSE portion is kept low, this reduces the current needed to cut the silicide layer using Joule heat generated by the passage of the current through the silicide layer. This allows the eFUSE portion to be cut without adversely affecting circuits around the eFUSE. To be specific, for example, the heat-resistant temperature of the first nickel alloy silicide layer used for the CMOS portion may be set at, for example, approximately 600° C. or more, and the heat-resistant temperature of the second nickel alloy silicide layer used for the eFUSE portion may be set at, for example, approximately 500° C. or less.

The semiconductor device of the fourth aspect of the present invention may further include a gate electrode formed on the semiconductor substrate. The eFUSE portion may be formed in a fine-line portion of the gate electrode. The fine-line portion of the gate electrode means a portion thereof having a narrower line width (of, for example, approximately 100 nm or less) than the other portions thereof. Such a line width facilitates breaking the silicide layer on the gate electrode.

The method of the fourth aspect may further include the steps of forming a gate electrode on the semiconductor substrate, and forming a contact on the gate electrode so as to be connected to the gate electrode. The eFUSE portion may be formed in a portion of the gate electrode connected to the contact.

A method for fabricating a semiconductor device according to a fifth aspect of the present invention including a CMOS portion and an eFUSE portion on a semiconductor substrate includes the steps of forming a first nickel alloy silicide layer on a region of the semiconductor substrate corresponding to the CMOS portion, and forming a second nickel alloy silicide layer on a region of the semiconductor substrate corresponding to the eFUSE portion. The heat-resistant temperature of the first nickel alloy silicide layer is higher than that of the second nickel alloy silicide layer.

In other words, the method of the fifth aspect of the present invention is for fabricating the semiconductor device of the fourth aspect of the present invention.

The method of the fifth aspect of the present invention may further include the step of forming a gate electrode on the semiconductor substrate. The eFUSE portion may be formed in a fine-line portion of the gate electrode.

The method of the fifth aspect of the present invention may further include the steps of forming a gate electrode on the semiconductor substrate, and forming a contact on the gate electrode so as to be connected to the gate electrode. The eFUSE portion may be formed in a portion of the gate electrode connected to the contact.

A method for fabricating a semiconductor device according to a sixth aspect of the present invention includes the steps of: forming a first gate electrode on a first region of a semiconductor substrate containing silicon and forming a second gate electrode on a second region of the semiconductor substrate; forming first source/drain regions in regions of the semiconductor substrate located to both sides of the first gate electrode and forming second source/drain regions in regions of the semiconductor substrate located to both sides of the second gate electrode; forming a nickel alloy silicide layer on at least either the first gate electrode or the first source/drain regions; and forming a nickel silicide layer on at least either the second gate electrode or the second source/drain regions. In the step of forming the nickel alloy silicide layer, a nickel alloy film and a first nickel film are sequentially deposited on the first region and then subjected to heat treatment, and in the step of forming the nickel silicide layer, a second nickel film is deposited on the second region and then subjected to heat treatment.

In other words, in the method of the sixth aspect of the present invention, the nickel alloy film whose composition is optimized to provide necessary heat resistance for elements or the like formed on the first region and the first nickel film are sequentially stacked on the substrate, and then the stacked layers are subjected to heat treatment, thereby forming a nickel alloy silicide layer. In addition, the second nickel film is deposited on the second region and then subjected to heat treatment, thereby forming a nickel silicide layer.

According to the method of the sixth aspect of the present invention, since the method of the first aspect of the present invention is applied to the method of the sixth aspect, the heat resistance of the nickel alloy silicide layer can be simply optimized. In addition, the nickel alloy silicide layer and the nickel silicide layer having different heat-resistant properties can be formed in arbitrary regions of the substrate.

In the method of the sixth aspect of the present invention, an alloyed metal contained in the nickel alloy film is preferably a metal causing a silicide reaction to occur at a higher temperature than Ni.

This increases the silicidation temperature of the whole layered film of the nickel alloy film and the nickel film with reliability.

A semiconductor device according to a seventh aspect of the present invention includes a nickel alloy silicide layer and a nickel silicide layer.

In other words, the semiconductor device of the seventh aspect of the present invention is a semiconductor device fabricated by the method of the sixth aspect of the present invention. In the semiconductor device of the seventh aspect of the present invention, like the method of the sixth aspect of the present invention, an alloyed metal contained in the nickel alloy silicide layer is preferably a metal causing a silicide reaction to occur at a higher temperature than Ni.

A method for fabricating a semiconductor device according to an eighth aspect of the present invention includes the steps of: forming a gate electrode on a semiconductor substrate containing silicon; forming source/drain regions in regions of the semiconductor substrate located to both sides of the gate electrode; forming a nickel silicide layer on at least either the gate electrode or the source/drain regions; and forming a platinum film on the nickel silicide layer and then subjecting the platinum film to heat treatment, thereby forming a silicide-stabilizing layer on the top surface of the nickel silicide layer.

According to the method of the eighth aspect of the present invention, since a silicide-stabilizing layer, more specifically, a platinum-containing layer, is formed on the top surface of the nickel silicide layer, the formation of the silicide-stabilizing layer can increase the heat-resistant temperature of the nickel silicide layer. In other words, the heat resistance of a nickel silicide can be enhanced with ease. In this way, a semiconductor device having a high-heat-resistance Ni silicide region can be easily provided.

A method for fabricating a semiconductor device according to a ninth aspect of the present invention includes the steps of: forming a first gate electrode on a first region of a semiconductor substrate containing silicon and forming a second gate electrode on a second region of the semiconductor substrate; forming first source/drain regions in regions of the semiconductor substrate located to both sides of the first gate electrode and forming second source/drain regions in regions of the semiconductor substrate located to both sides of the second gate electrode; forming a first nickel silicide layer on at least either the first gate electrode or the first source/drain regions, then forming a platinum film on the first nickel silicide layer, and then subjecting the platinum film to heat treatment, thereby forming a silicide-stabilizing layer on the top surface of the first nickel silicide layer; and forming a second nickel silicide layer on at least either the second gate electrode or the second source/drain regions.

According to the method of the ninth aspect of the present invention, a semiconductor device having a high-heat-resistance Ni silicide region can be easily provided by applying the method of the eighth aspect of the present invention.

In the method of the ninth aspect of the present invention, the first nickel silicide layer and the second nickel silicide layer are preferably formed in the same step, and then while the second nickel silicide layer is covered with the protective film, the platinum film is preferably formed on the first nickel silicide layer and then subjected to heat treatment, thereby forming a silicide-stabilizing layer on the top surface of the first nickel silicide layer.

Thus, although two photolithography processes and two dry etching processes have conventionally been needed to provide a high-heat-resistance Ni silicide region and a low-heat-resistance Ni silicide region, one photography process and one dry etching process can provide a desired device structure having a high-heat-resistance Ni silicide region and a low-heat-resistance Ni silicide region.

In the method of the eighth or ninth aspect of the present invention, a ruthenium film may be used instead of the platinum film. Also in this case, the same effects as described above can be obtained.

In the method of the eighth or ninth aspect of the present invention, the platinum film preferably has a thickness of 0.6 nm or less. This provides the above-described effects with reliability.

A semiconductor device according to a tenth aspect of the present invention includes a nickel silicide layer. The top surface of the nickel silicide layer is formed with a silicide-stabilizing layer containing platinum.

In other words, the semiconductor device of the tenth aspect of the present invention is a semiconductor device fabricated by the method of the eighth aspect of the present invention. The platinum concentration in the nickel silicide layer including the silicide-stabilizing layer may become higher with increasing proximity to the top surface of the silicide-stabilizing layer. In the semiconductor device of the tenth aspect of the present invention, the silicide-stabilizing layer may contain ruthenium instead of platinum. The semiconductor device of the tenth aspect of the present invention may further include another nickel silicide layer.

As described above, according to the present invention, a Ni alloy silicide having desired heat resistance for a semiconductor device to be fabricated can be formed in a desired region of the semiconductor device. Therefore, a semiconductor device that is less likely to cause failures and capable of being miniaturized and increased in operation speed can be achieved by optimizing the heat resistance of the Ni alloy silicide in units of groups of specific elements formed in, for example, an ultra large scale integrated circuit (ULSI).

According to the present invention, the heat resistance of nickel silicide can be enhanced with ease. In this way, a semiconductor device having a high-heat-resistance Ni silicide region can be easily provided.

The present invention relates to a semiconductor device and a fabrication method for the same and provides the following effects: When the present invention is applied to a semiconductor integrated circuit device or other devices having a silicide layer, the heat resistance of silicide can be simply optimized, and a plurality of silicides having different heat-resistant properties can be formed in desired regions of the semiconductor device. In view of the above, the present invention is very useful.

BRIEF DESCRIPTION OF THE DRAWINGS

FIGS. 2A through 2C are cross-sectional views illustrating other ones of the process steps in the fabrication method for a semiconductor device according to the first embodiment of the present invention.

FIGS. 3A through 3C are cross-sectional views illustrating still other ones of the process steps in the fabrication method for a semiconductor device according to the first embodiment of the present invention.

FIGS. 4A through 4C are cross-sectional views illustrating yet other ones of the process steps in the fabrication method for a semiconductor device according to the first embodiment of the present invention.

FIGS. 5A and 5B are cross-sectional views illustrating further ones of the process steps in the fabrication method for a semiconductor device according to the first embodiment of the present invention.

FIG. 10 is a table illustrating the characteristics of alloyed metals that can be used for Ni alloys for forming Ni alloy silicides in the semiconductor devices according to the first through third embodiments of the present invention.

FIGS. 11A and 11B are cross-sectional views illustrating some of process steps in a fabrication method for a semiconductor device according to a modification of the first embodiment of the present invention.

FIGS. 15A and 15B are cross-sectional views illustrating some of process steps in a fabrication method for a semiconductor device according to a first example of a fourth embodiment of the present invention.

FIGS. 16A and 16B are cross-sectional views illustrating other ones of the process steps in the fabrication method for a semiconductor device according to the first example of the fourth embodiment of the present invention.

FIGS. 20A and 20B are cross-sectional views illustrating other ones of the process steps in the fabrication method for a semiconductor device according to the second example of the fourth embodiment of the present invention.

DETAILED DESCRIPTION OF THE INVENTION

Embodiment 1

A semiconductor device according to a first embodiment of the present invention and a fabrication method for the same will be described hereinafter with reference to the drawings. FIGS. 1A through 1C, 2A through 2C, 3A through 3C, 4A through 4C, and 5A and 5B are cross-sectional views illustrating process steps in a fabrication method for a semiconductor device according to this embodiment, more specifically, a fabrication method for a semiconductor device having a metal oxide semiconductor (MOS) transistor.

Figure 1A:
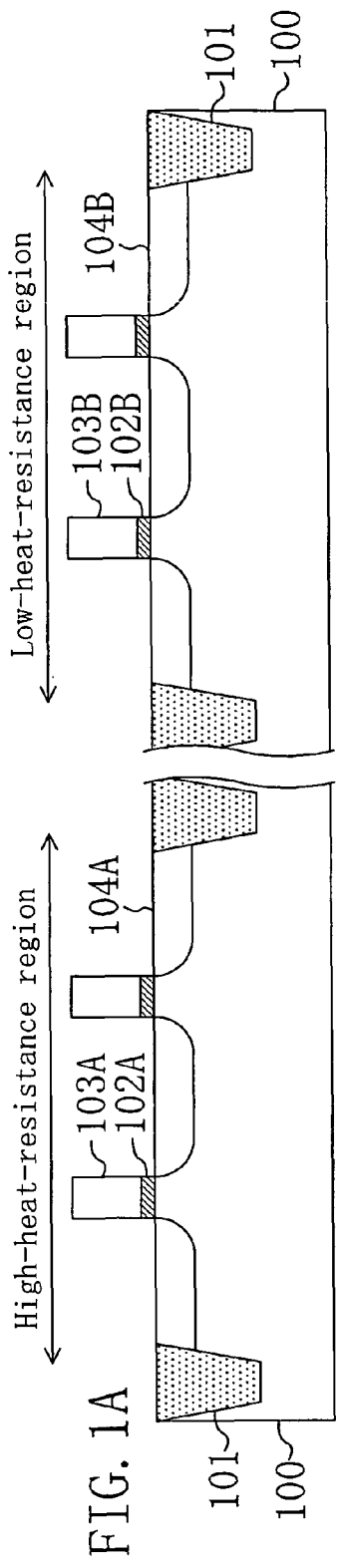
FIGS. 1A through 1C are cross-sectional views illustrating some of process steps in a fabrication method for a semiconductor device according to a first embodiment of the present invention.

First, as shown in FIG. 1A, a shallow trench isolation region 101 is formed in an upper portion of a semiconductor substrate 100, such as a silicon substrate, thereby defining a region requiring relatively high heat resistance (for example, a region in which a complementary metal-oxide semiconductor (CMOS) device is to be formed: hereinafter, referred to as "high-heat-resistance region") and a region requiring relatively low heat resistance (for example, a region in which an eFUSE is to be formed: hereinafter, referred to as "low-heat-resistance region"). Thereafter, for example, an approximately 2-nm-thick silicon oxide film that will become gate insulating films and, for example, an approximately 140-nm-thick polysilicon film that will become gate electrodes are sequentially formed on the silicon substrate 100. Subsequently, the polysilicon film is selectively etched. In this manner, gate electrodes 103A are formed on the high-heat-resistance region of the substrate 100 with gate insulating films 102A interposed therebetween, and gate electrodes 103B are formed on the low-heat-resistance region thereof with gate insulating films 102B interposed therebetween. Then, ions are implanted into the semiconductor substrate 100 using the gate electrodes 103A and 103B as masks. In this way, low concentration impurity diffusion layers 104A and 104B are formed in the high-heat-resistance region and low-heat-resistance region of the silicon substrate 100, respectively, in a self aligned manner.

Figure 1B:
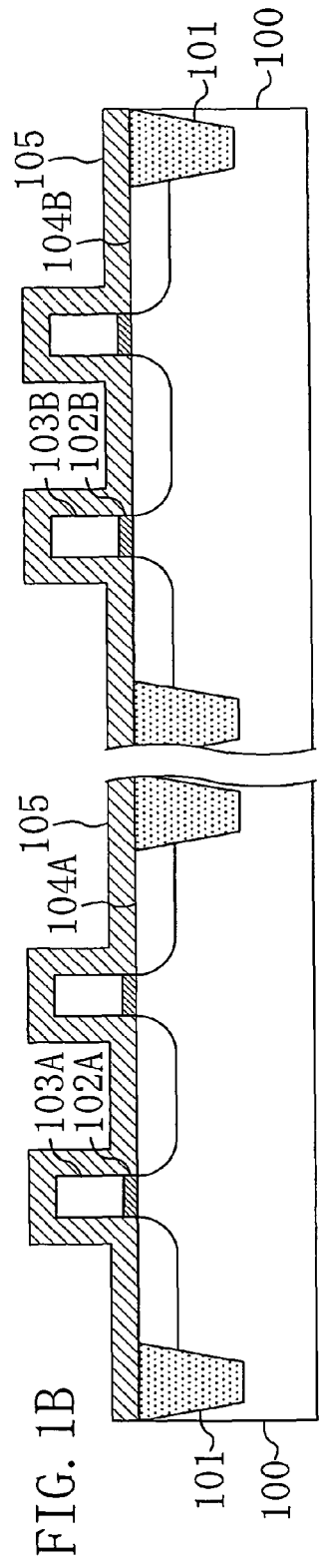

Next, as shown in FIG. 1B, an insulating film 105 of silicon oxide is deposited to a thickness of, for example, approximately 50 nm over the entire surface of the silicon substrate 100 by low pressure (LP)-chemical vapor deposition (CVD) under conditions of, for example, a susceptor temperature of 400° C.

Figure 1C:
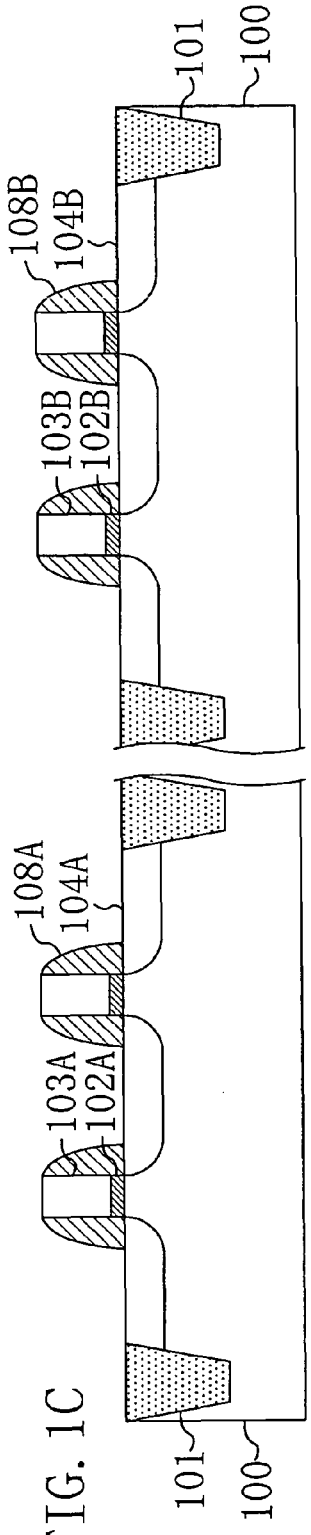

Then, as shown in FIG. 1C, the entire surface of the insulating film 105 is etched back by dry etching under conditions of, for example, a $CHF_3$ flow rate of 120 ml/min (standard condition), an $O_2$ flow rate of 5 ml/min (standard condition), a pressure of 8 Pa, and a power of 110 W, thereby forming sidewall spacers 108A and 108B on the side faces of the gate electrodes 103A and 103B, respectively.

Next, as shown in FIG. 2A, ions are implanted into the semiconductor substrate 100 using a combination of the gate electrode 103A and the sidewall spacers 108A and a combination of the gate electrode 103B and the sidewall spacers 108B as masks. In this way, high concentration impurity diffusion layers 109A and 109B that will become source/drain regions are formed in the high-heat-resistance region and low-heat-resistance region of the semiconductor substrate 100, respectively, in a self aligned manner.

Next, as shown in FIG. 2B, for example, a 50-nm-thick silicon oxide film is formed, as a first protective film 110 for prevention of silicide formation (hereinafter, referred to as "first anti-silicidation protective film 110"), over the entire surface of the silicon substrate 100 by sub atmospheric (SA)-CVD, for example, using tetra ethyl ortho silicate (TEOS) as a material gas and using $O_3$ as an oxidant.

Next, as shown in FIG. 2C, a resist film 111 is formed over the entire surface of the first anti-silicidation protective film 110 through a photolithography process to expose only the high-heat-resistance region.

Next, a portion of the first anti-silicidation protective film 110 located on the high-heat-resistance region is removed by dry etching using the resist film 111 as a mask. Thereafter, as shown in FIG. 3A, the resist film 111 covering the low-heat-resistance region is removed by ashing and cleaning, and simultaneously the top surface of the high-heat-resistance region of the silicon substrate 100 is purified.

Next, as shown in FIG. 3B, a 2-nm-thick first Ni alloy film made of, for example, an alloy M of a metal A and Ni is entirely deposited on the silicon substrate 100, for example, by sputtering. Thereafter, for example, a 10-nm-thick first Ni film is deposited to cover the first Ni alloy film, thereby forming a layered film 112 of the first Ni alloy film and the first Ni film. In this process step, the first Ni alloy film is formed to produce Ni alloy silicides having desired heat resistance for the high-heat-resistance region. The type of the alloyed metal A included in the Ni alloy M forming the first Ni alloy film is not particularly limited. However, a metal causing a silicide reaction to occur at a higher temperature than Ni, i.e., for example, one of the following metals capable of forming a silicide having a higher melting point than $Ni_2Si$ or NiSi according to the relational expression "Tf (the temperature at which a silicide reaction occurs)=0.4×Tm (the melting point of the silicide)" disclosed, for example, in non-patent literature 7: P. Gas and F. M. d'Heurle, "Kinetics of formation of TM silicide thin films: self-diffusion", Properties of Metal Silicides, January 1995, p.279-292, is preferably used as the alloyed metal A: vanadium (V); molybdenum (Mo); cobalt (Co); niobium (Nb); tantalum (Ta); tungsten (W); zirconium (Zr); manganese (Mn); iron (Fe); iridium (Ir); ruthenium (Ru); rhodium (Rh); or hafnium (Hf). Use of one of the above-mentioned metals certainly increases the silicidation temperature of the whole layered film 112. Selected is the composition of the Ni alloy M (the Ni content in the alloy M) best suited to providing desired heat resistance for the Ni alloy silicides on the high-heat-resistance region.

Next, as shown in FIG. 3C, the layered film 112 is subjected to heat treatment using, for example, rapid thermal annealing (RTA) as a first salicide process. In this way, silicon forming the high concentration impurity diffusion layers 109A and the gate electrodes 103A on the high-heat-resistance region is caused to react with the layered film 112, thereby forming first nickel alloy silicide layers 113 on the high concentration impurity diffusion layers 109A and the gate electrodes 103A. Thereafter, unreacted part of the metal (unreacted part of the layered film 112) located on the high-heat-resistance region and part of the layered film 112 located over the first anti-silicidation protective film 110 on the low-heat-resistance region are removed using, for example, a sulfuric acid-hydrogen peroxide mixture (SPM) solution.

Next, as shown in FIG. 4A, for example, a 50-nm-thick silicon oxide film is formed, as a second protective film 114 for prevention of silicide formation (hereinafter, referred to as "second anti-silicidation protective film 114"), over the entire surface of the silicon substrate 100 by SA-CVD, for example, using TEOS as a material gas and using $O_3$ as an oxidant.

Next, as shown in FIG. 4B, a resist film 115 is formed over the entire surface of the second anti-silicidation protective film 114 through a photolithography process to expose only the low-heat-resistance region.

Next, a portion of the second anti-silicidation protective film 114 and the first anti-silicidation protective film 110 both located on the low-heat-resistance region are removed by dry etching using the resist film 115 as a mask. Thereafter, as shown in FIG. 4C, the resist film 115 covering the high-heat-resistance region is removed by ashing and cleaning, and simultaneously the top surface of the low-heat-resistance region of the silicon substrate 100 is purified.

Next, as shown in FIG. 5A, a 2-nm-thick second Ni alloy film made of, for example, an alloy M' of a metal B and Ni is entirely deposited on the silicon substrate 100, for example, by sputtering. Thereafter, for example, a 10-nm-thick second Ni film is deposited to cover the second Ni alloy film, thereby forming a layered film 116 of the second Ni alloy film and the second Ni film. In this process step, the second Ni alloy film is formed to produce Ni alloy silicides having desired heat resistance for the low-heat-resistance region. The type of the alloyed metal B included in the Ni alloy M' forming the second Ni alloy film is not particularly limited. However, a metal causing a silicide reaction to occur at a higher temperature than Ni, i.e., for example, one of the following metals capable of forming a silicide having a higher melting point than $Ni_2Si$ or NiSi, are preferably used as the alloyed metal B: vanadium (V); molybdenum (Mo); cobalt (Co); niobium (Nb); tantalum (Ta); tungsten (W); zirconium (Zr); manganese (Mn); iron (Fe); iridium (Ir); ruthenium (Ru); rhodium (Rh); or hafnium (Hf). Use of one of the above-mentioned metals certainly increases the silicidation temperature of the whole layered film 116. Selected is the composition of the Ni alloy M' (the Ni content in the alloy M') best suited to providing desired heat resistance for the Ni alloy silicides located on the low-heat-resistance region.

Finally, as shown in FIG. 5B, the layered film 116 is subjected to heat treatment using, for example, RTA as a second salicide process. In this way, silicon forming the heavily-doped layers 109B and the gate electrodes 103B on the low-heat-resistance region is caused to react with the layered film 116, thereby forming second nickel alloy silicide layers 117 on the high concentration impurity diffusion layers 109B and the gate electrodes 103B. Thereafter, unreacted part of the metal (unreacted part of the layered film 116) located on the low-heat-resistance region and part of the layered film 116 located over the second anti-silicidation protective film 114 on the high-heat-resistance region are removed using, for example, a SPM solution.

Figure 6:
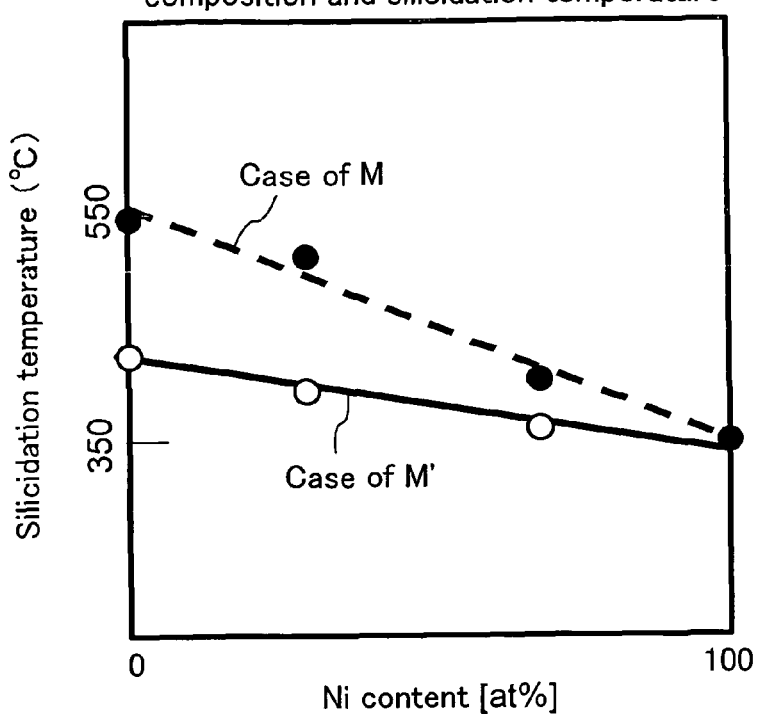
FIG. 6 is a graph showing the relationship between the Ni content in a Ni alloy and the silicidation temperature of the Ni alloy, which was examined by the present inventors.

FIG. 6 illustrates the relationship between the Ni content in the Ni alloy and the silicidation temperature of the Ni alloy forming an interface layer. Referring to FIG. 6, Hf or Zr is used as the metal A in the alloy M, and Pt is used as the metal B in the alloy M'. As shown in FIG. 6, the Ni content in the Ni alloy is substantially proportional to the silicidation temperature of the Ni alloy.

Figure 7:
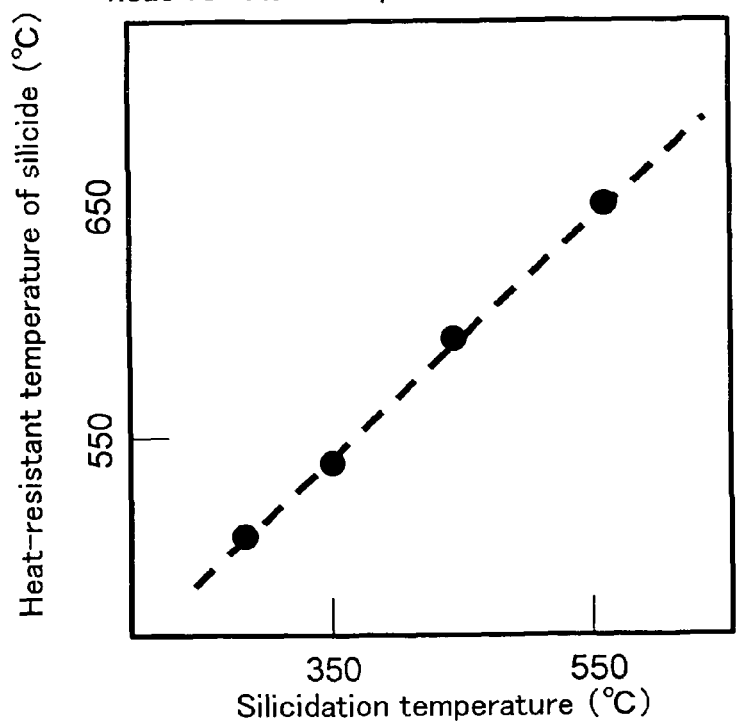
FIG. 7 is a graph showing the relationship between the silicidation temperature of the Ni alloy and the heat resistance (heat-resistant temperature) of a Ni alloy silicide resulting from silicidation of a layered film of a film made of the Ni alloy and a Ni film, which was examined by the present inventors.

FIG. 7 illustrates the relationship between the silicidation temperature of the Ni alloy and the heat resistance (heat-resistant temperature) of a Ni alloy silicide resulting from silicidation of a layered film of a film made of the Ni alloy (lower layer) and a Ni film (upper layer). As shown in FIG. 7, the heat resistance of the Ni alloy silicide is proportional to the silicidation temperature of the Ni alloy forming the interface layer.

In view of the relationships shown in FIGS. 6 and 7, the Ni contents in Ni alloys M and M' can be set as follows.

(1) In a case where M=M' is selected, i.e., in a case where the type of an alloyed metal in the Ni alloy M is identical with that of an alloyed metal in the Ni alloy M', the Ni content in the Ni alloy M used for a high-heat-resistance region of a substrate is set at XL representing a relatively small Ni content, and the Ni content in the Ni alloy M' (=M) used for a low-heat-resistance region thereof is set at XH representing a relatively large Ni content. On condition that the thickness of a Ni film (first Ni film) formed on a film made of the Ni alloy M (first Ni alloy film) is equal to or smaller than that of a Ni film (second Ni film) formed on a film made of the Ni alloy M' (second Ni alloy film) when M is identical with M' and the first Ni alloy film has the same thickness as the second Ni alloy film, first nickel alloy silicide layers 113 each have a smaller Ni content than second nickel alloy silicide layers 117.

(2) In a case where M and M' are different from each other (for example, as shown by the solid line and the broken line in FIG. 6), i.e., in a case where the type of an alloyed metal in the Ni alloy M is different from that of an alloyed metal in the Ni alloy M', even if the Ni content in the Ni alloy M used for the high-heat-resistance region is set at the same value as that in the Ni alloy M' (=M) used for the low-heat-resistance region, desired heat resistance can be achieved for both the high-heat-resistance region and the low-heat-resistance region. The reason for this is that as shown in FIG. 6, the silicidation temperature of the Ni alloy M is higher than that of the Ni alloy M'. In the case where M and M' are different from each other, an alloyed metal included in the first nickel alloy silicide layers 113 is naturally different from an alloyed metal included in the second nickel alloy silicide layers 117. Furthermore, when in this case a film made of the Ni alloy M (first Ni alloy film) is set to have the same thickness and Ni content as a film made of the Ni alloy M' (second Ni alloy film) and the first Ni film formed on the first Ni alloy film is set to have the same thickness as the second Ni film formed on the second Ni alloy film, the first nickel alloy silicide layers 113 have the same Ni content as the second nickel alloy silicide layers 117. Otherwise, the first nickel alloy silicide layers 113 have a different Ni content from the second nickel alloy silicide layers 117.

As described above, according to the first embodiment, for example, in a high-heat-resistance region of a substrate, the silicidation temperature is increased because of the first Ni alloy film. This permits an increase in the heat-resistant temperature (heat resistance) of first nickel alloy silicide layers 113 proportional to the above-mentioned silicidation temperature. More particularly, a first Ni film forming the upper layer of a layered film 112 starts being silicided only after the first Ni alloy film forming the lower layer thereof starts being silicided. Therefore, the silicidation temperature of the whole layered film 112 of the first Ni alloy film and the first Ni film becomes higher than that of a Ni layer alone. The silicidation temperature can be controlled by the type of an alloyed metal in a Ni alloy film and the Ni content therein. In view of the above, the heat-resistant properties (heat-resistant temperatures) of the first nickel alloy silicide layers 113 and the second nickel alloy silicide layers 117 can be simply optimized.

Furthermore, according to the first embodiment, the Ni content in the nickel alloy silicide layers 113 or 117 can be easily adjusted by the ratio in thickness between the Ni alloy film and the Ni film. To be specific, a relative reduction in the thickness of the Ni alloy film allows formation of nickel alloy silicide layers 113 or 117 having a high Ni content, i.e., low-electrical-resistance nickel alloy silicide layers 113 or 117, while achieving desired heat resistance. In view of the above, for example, high-heat-resistance first nickel alloy silicide layers 113 of low electrical resistance are achieved.

Moreover, according to the first embodiment, as described above, two types of. nickel alloy silicide layers 113 and 117 having different heat-resistant properties can be formed on arbitrary regions of a substrate by appropriately selecting the type of an alloyed metal in the Ni alloy film representing the lower layer (interface layer) and the Ni content therein. In other words, two types of nickel alloy silicide layers 113 and 117 having different heat-resistant properties can be formed on arbitrary regions of the substrate without preparing a plurality of targets to be sputtered corresponding to desired heat resistance. It is needless to say that the fabrication method for a semiconductor device according to the first embodiment may be applied as follows: Three or more types of nickel alloy silicide layers having different heat-resistant properties may be formed on arbitrary regions of the substrate.

Although in the first embodiment a silicon substrate is used as a semiconductor substrate 100, any other substrate containing Si, such as a SiGe substrate, may be used instead of the silicon substrate. Although in the first embodiment a polysilicon film is used as a material of gate electrodes 103A and 103B, any other film containing Si may be used instead of the polysilicon film.

In the first embodiment, nickel alloy silicide layers are formed on gate electrodes formed on the high-heat-resistance and low-heat-resistance regions and source/drain regions (high concentration impurity diffusion layers) formed therein. However, nickel alloy silicide layers of this embodiment may be formed on either gate electrodes or source/drain regions instead.

To be specific, after the execution of the above-mentioned process step shown in FIG. 4C, the following process steps are carried out instead of the process steps shown in FIGS. 5A and 5B. As shown in FIG. 11A, for example, an approximately 10-nm-thick Ni film is entirely deposited on the silicon substrate 100, for example, by sputtering, and then, for example, an approximately 15-nm-thick TiN film for preventing oxidation is deposited to cover the Ni film, thereby forming a layered film 118 of the Ni film and the TiN film. In the purification process step shown in FIG. 4C, the top surfaces of silicon regions to be caused to react with Ni may be purified by removing native oxide films produced on silicon forming source/drain regions in the low-heat-resistance region of the substrate and polysilicon forming gate electrodes 103B on the low-heat-resistance region, for example, using diluted hydrofluoric acid (DHF). Furthermore, in the process step shown in FIG. 11A, the Ni film may be deposited by sputtering under conditions of, for example, a power density of approximately 2 W/cm$^2$, an Ar flow rate of approximately 10 ml/min (standard condition), and a pressure of approximately 1 mTorr (133 mPa). In addition, in the process step shown in FIG. 11A, the TiN film may be deposited, for example, by reactive sputtering under conditions of a power density of approximately 4 W/cm$^2$, a nitrogen flow rate of approximately 100 ml/min (standard condition), an Ar flow rate of approximately 20 ml/min (standard condition), and a pressure of approximately 10 through 20 mTorr (1333 through 2666 mPa). Subsequently, after the process step shown in FIG. 11A, the layered film 118 is subjected to heat treatment using, for example, an RTA device, thereby causing silicon forming source/drain regions in the low-heat-resistance region of the substrate and polysilicon forming the gate electrodes 103B to react with Ni in the layered film 118. In this way, as shown in FIG. 11B, nickel silicide layers 119 are formed on the source/drain regions, i.e., high concentration impurity diffusion layers 109B, and the gate electrodes 103B. The above-mentioned heat treatment may be performed in two steps. To be specific, the layered film 118 is subjected to the first heat treatment in an inert atmosphere at a temperature of approximately 300° C. for approximately 30 seconds, for example, using a RTA device. Then, unreacted part of the layered film 118 is removed, for example, using a SPM solution. Thereafter, the part of the layered film 118 that has undergone a silicide reaction by the first heat treatment is subjected to the second heat treatment in an inert atmosphere at a temperature of approximately 550° C. for approximately 30 seconds, for example, using a RTA device. In this way, approximately 20-nm-thick nickel silicide layers 119 are formed.

Embodiment 2

Figure 8A:
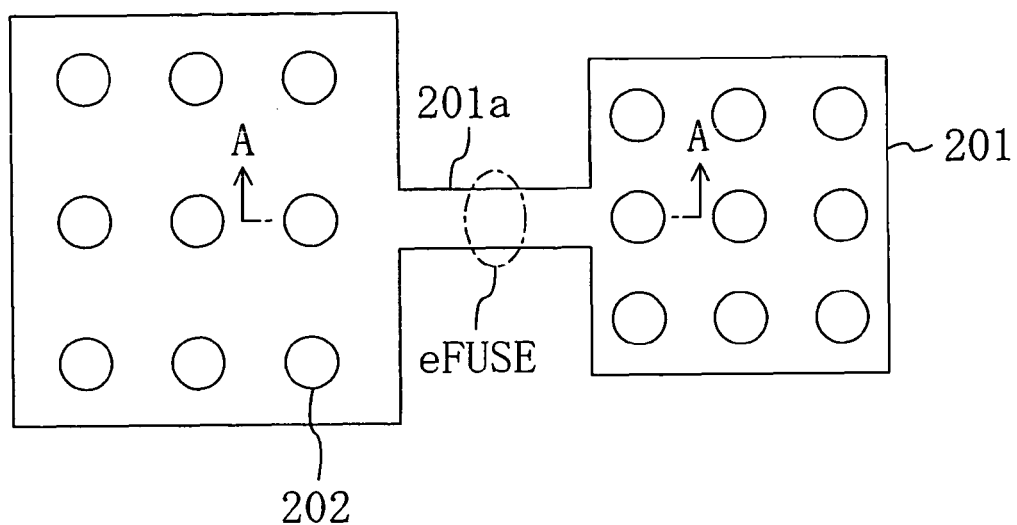
FIG. 8A is a plan view of an eFUSE portion of a semiconductor device according to a second embodiment of the present invention.
Figure 8B:
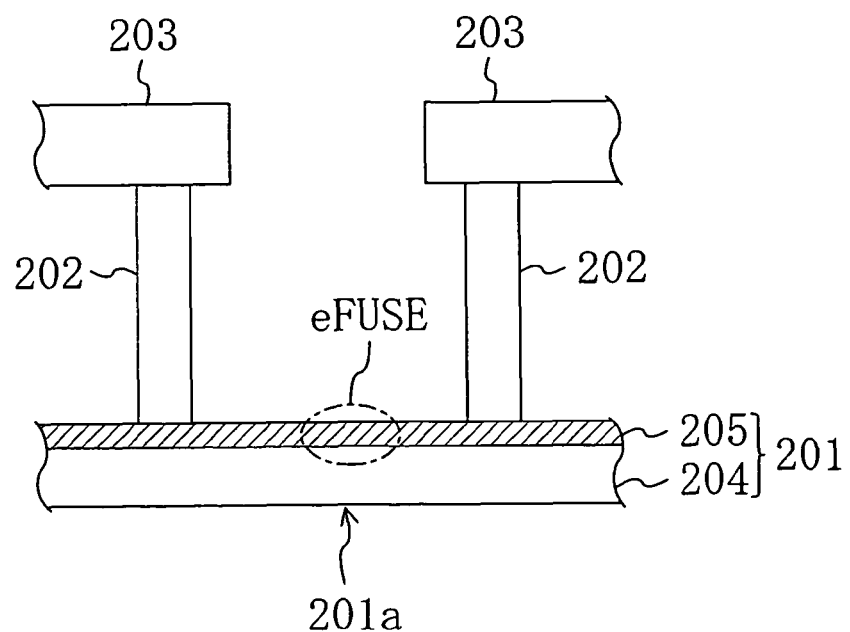
FIG. 8B is a cross-sectional view taken along the line A-A in FIG. 8A.

A semiconductor device according to a second embodiment of the present invention and a fabrication method for the same will be described hereinafter with reference to the drawings. The semiconductor device of the second embodiment represents a semiconductor device formed with a CMOS portion and an eFUSE portion on a semiconductor substrate. FIG. 8A is a plan view of the eFUSE portion of the semiconductor device according to the second embodiment. FIG. 8B is a cross-sectional view taken along the line A-A in FIG. 8A. The CMOS portion of the semiconductor device according to the second embodiment has the same structure as, for example, each of some of MOS transistors of the first embodiment (shown in FIG. 5B) formed on a high-heat-resistance region and is formed by the same method as the MOS transistor of the first embodiment. Thus, the CMOS portion is not shown and described.

As illustrated in FIGS. 8A and 8B, a gate electrode 201 is disposed on a semiconductor substrate (unshown) to have a fine-line portion 201a serving as an eFUSE. A lower polysilicon layer 204 and an upper nickel alloy silicide layer 205 form the gate electrode 201. The nickel alloy silicide layer 205 is formed by the same method as the second nickel alloy silicide layer 117 of the first embodiment (as shown in FIG. 5B) formed on the low-heat-resistance region. In other words, the heat-resistant temperature of the nickel alloy silicide layer 205 is lower than that of each of nickel alloy silicide layers for the CMOS portion (first nickel alloy silicide layers 113 of the first embodiment formed on the high-heat-resistance region). Both lateral end portions of the gate electrode 201 between which the fine-line portion 201a is interposed are connected through a plurality of contacts 202 to an upper interconnect 203. In FIG. 8A, the upper interconnect 203 is not shown.

According to the second embodiment, since the heat resistance of a part of the nickel alloy silicide layer 205 corresponding to the eFUSE portion is kept low, this reduces the current needed to cut the silicide layer 205 using Joule heat generated by the passage of the current through the silicide layer 205. This allows the eFUSE portion to be cut without adversely affecting circuits around the eFUSE.

In the second embodiment, the heat-resistant temperature of each of the nickel alloy silicide layers used for the CMOS portion may be set at, for example, approximately 600° C. or more, and the heat-resistant temperature of the nickel alloy silicide layer 205 used for the eFUSE portion may be set at, for example, approximately 500° C. or less.

Furthermore, in the second embodiment, the eFUSE is formed in the fine-line portion 201a of the gate electrode 201. However, the location in which the eFUSE is formed is not particularly limited.

In the second embodiment, instead of the nickel alloy silicide layer 205, a nickel silicide layer may be used as a silicide layer for the eFUSE portion.

Embodiment 3

Figure 9A:
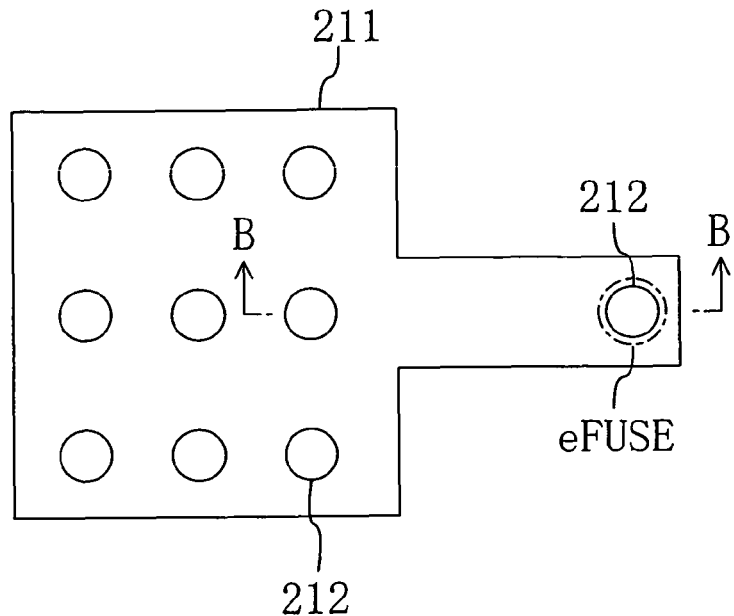
FIG. 9A is a plan view of an eFUSE portion of a semiconductor device according to a third embodiment of the present invention.
Figure 9B:
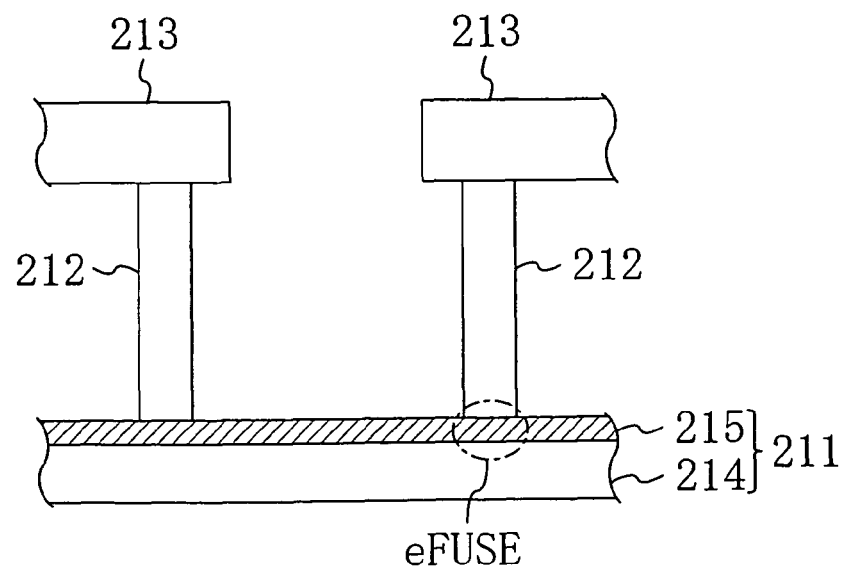
FIG. 9B is a cross-sectional view taken along the line B-B in FIG. 9A.

A semiconductor device according to a third embodiment of the present invention and a fabrication method for the same will be described hereinafter with reference to the drawings. The semiconductor device of the third embodiment represents a semiconductor device formed with a CMOS portion and an eFUSE portion on a semiconductor substrate. FIG. 9A is a plan view of the eFUSE portion of the semiconductor device according to the third embodiment. FIG. 9B is a cross-sectional view taken along the line B-B in FIG. 9A. The CMOS portion of the semiconductor device according to the third embodiment has the same structure as, for example, each of some of MOS transistors of the first embodiment (shown in FIG. 5B) formed on a high-heat-resistance region of a substrate and is formed by the same method as the MOS transistor. Thus, the CMOS portion is not shown and described.

As shown in FIGS. 9A and 9B, a gate electrode 211 is disposed on a semiconductor substrate (unshown) and formed of a lower polysilicon layer 214 and an upper nickel alloy silicide layer 215. The nickel alloy silicide layer 215 is formed by the same method as the second nickel alloy silicide layer 117 of the first embodiment (shown in FIG. 5B) formed on the low-heat-resistance region. In other words, the heat-resistant temperature of the nickel alloy silicide layer 215 is lower than that of each of nickel alloy silicide layers for the CMOS portion (first nickel alloy silicide layers 113 of the first embodiment formed on the high-heat-resistance region). One end portion of the gate electrode 211 is connected through a plurality of contacts 212 to an upper interconnect 213, and the other end portion thereof is connected through a single contact 212 to the upper interconnect 213. In this embodiment, an eFUSE is formed in a part of the other end portion of the gate electrode 211 connected to the single contact 212. In FIG. 9A, the upper interconnect 213 is not shown.

According to the third embodiment, since the heat resistance of a part of the nickel alloy silicide layer 215 corresponding to the eFUSE portion is kept low, this reduces the current needed to cut the silicide layer 215 using Joule heat generated by the passage of the current through the silicide layer 215. This allows the eFUSE portion to be cut without adversely affecting circuits around the eFUSE.

In the third embodiment, the heat-resistant temperature of each of the nickel alloy silicide layers used for the CMOS portion may be set at, for example, approximately 600° C. or more, and the heat-resistant temperature of the nickel alloy silicide layer 215 used for the eFUSE portion may be set at, for example, approximately 500° C. or less.

In the third embodiment, the eFUSE is formed in a part of the gate electrode 211 connected to the contact 212. However, the location in which the eFUSE is formed is not particularly limited.

In the third embodiment, a substrate containing Si, such as a silicon substrate, is used as a semiconductor substrate. Although a polysilicon film is used as a material of the gate electrode 211, any other film containing Si may be used instead of the polysilicon film.

In the third embodiment, instead of the nickel alloy silicide layer 215, a nickel silicide layer may be used as a silicide layer for the eFUSE portion.

In the first through third embodiments, the type of an alloyed metal included in a Ni alloy film (interface layer) for forming a nickel alloy silicide layer on each of high-heat-resistance and low-heat-resistance regions is not particularly limited. However, any arbitrary metal as shown in FIG. 10 may be used in accordance with the desired heat resistance. The heat resistance is determined based on the type of the alloyed metal and the Ni content in the alloy. Thus, for example, silicides can be formed using the same alloyed metal to have different heat-resistant properties, and silicides can be formed using different alloyed metals to have the same heat-resistant properties. More specifically, in a case where an alloyed metal capable of forming silicides having a higher melting point than NiSi is used, the heat resistance (heat-resistant temperature) of the resultant silicides increases with a reduction in the Ni content in the Ni alloy. Furthermore, the electrical resistance of the resultant Ni alloy silicides is determined based on the Ni content in the silicides, i.e., the Ni content in the alloy and the ratio in thickness between the Ni alloy film and the Ni film. Therefore, for example, suicides can be formed using alloyed metals having the same Ni content to have different electrical resistances, and silicides can be formed using alloyed metals having different Ni contents to have the same electrical resistance.

Embodiment 4

A semiconductor device according to a fourth embodiment of the present invention and a fabrication method for the same will be described hereinafter with reference to the drawings.

Figure 12:
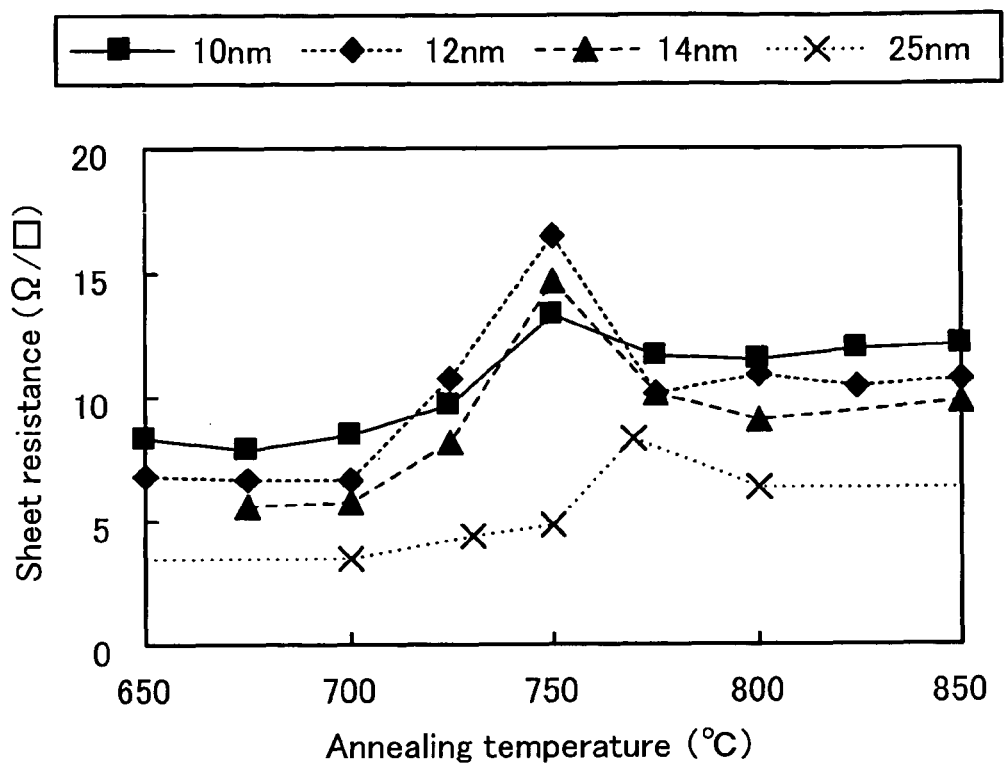
FIG. 12 is a graph showing the results obtained by the present inventors' survey of the relationship between the annealing temperatures and sheet resistances of $NiSi_x$ layers formed of Ni films having different thicknesses.

An invention according to this embodiment is based on results obtained by the present inventors' experiment for analyzing the process of agglomeration of NiSi in detail. First, details on the experiment will be described. In this experiment, the top surface of a silicon substrate is initially cleaned by hydrofluoric acid (HF), and then a Ni film is deposited on the silicon substrate by Ar sputtering to have a thickness of 10 through 25 mn. This sputtering is carried out using a nickel (Ni) target under conditions of a pressure of 2 mTorr (266 mPa) and a DC power of 100 W. Next, in order to cause a silicide reaction between the silicon substrate and the Ni film, the silicon substrate is annealed in an inert atmosphere for approximately 60 seconds by a RTA device. The temperature at which the silicon substrate is annealed (hereinafter, referred to as "annealing temperature") is set in the range of approximately 650 through 850° C. FIG. 12 illustrates results obtained by measuring the sheet resistance of a combination of a $NiSi_x$ layer (x=1 through 2) formed by annealing and the substrate (regions of the substrate in which doped layers corresponding to source/drain regions are formed). In FIG. 12, the axis of abscissas represents the annealing temperature, and the axis of ordinates represents the sheet resistance. More particularly, FIG. 12 illustrates the relationship between the annealing temperatures and sheet resistances of $NiSi_x$ layers formed using Ni films of different thicknesses. The peaks of the sheet resistances near 750° C. as shown in FIG. 12 represent the points at which the phases of the formed $NiSi_x$ (x=1 through 2) layers are changed (the points of change from the NiSi phase to $NiSi_2$ phase). More particularly, for suicides formed using 10- through 14-nm-thick deposited Ni films, the range of annealing temperatures up to approximately 700° C. represents a low-electrical-resistance region exhibiting the NiSi phase, the range of annealing temperatures of 700 through 775° C. represents the state in which the NiSi phase and the $NiSi_2$ phase are mixed, and the range of annealing temperatures of approximately 775° C. or higher represents a high-electrical-resistance region exhibiting the $NiSi_2$ phase. Furthermore, it has been found that when the surface roughness of these $NiSi_x$ layers is measured using an atomic force microscope (AFM) on condition that the annealing temperature thereof is higher than 700° C., the surface roughness increases. This indicates that the temperature at which NiSi is agglomerated on the flat top surface of the silicon substrate is approximately 700° C. For a silicide formed using a 25-nm-thick deposited Ni film, the peak of the sheet resistance is seen at approximately 775° C., and the upper limit of the low-electrical-resistance region exhibiting the NiSi phase is also increased to approximately 730 through 750° C. The above-mentioned experiment results verify the results described in non-patent literature 8: F. F. Zhao et al., "Thermal stability study of NiSi and $NiSi_2$ thin films", Microelectronic Engineering 71, 2004, p. 104-111.

Figure 13:
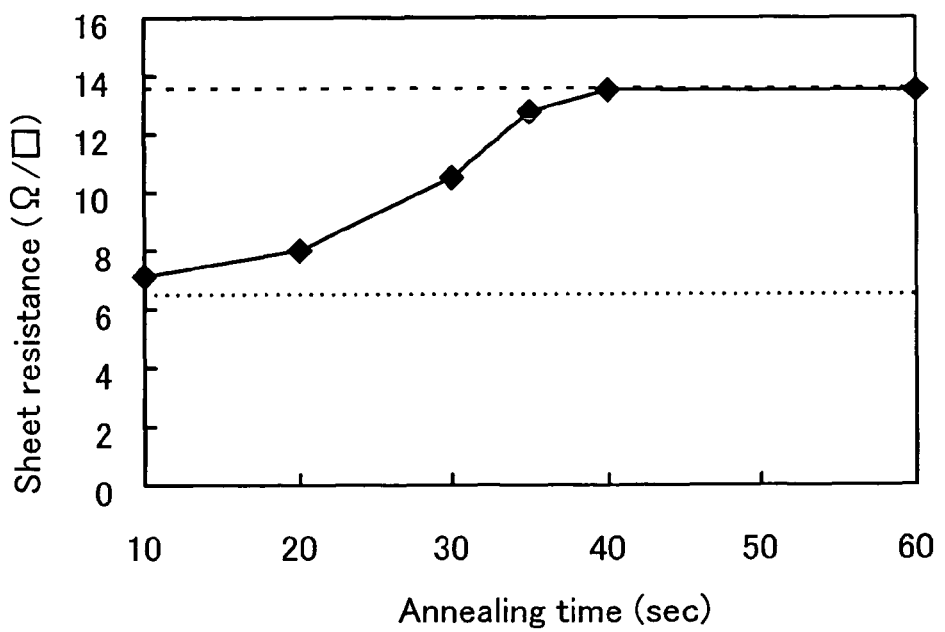
FIG. 13 is a graph illustrating a result obtained by the present inventors' survey of the dependence of the sheet resistance of a $NiSi_x$ layer on the annealing time thereof at an annealing temperature of 750° C.

Next, the present inventors surveyed the dependence of the sheet resistance on the time during which a substrate is annealed (hereinafter, referred to as "annealing time") at an annealing temperature of 750° C. to review a mechanism for NiSi agglomeration following the above-mentioned phase change from the NiSi phase to the $NiSi_2$ phase near an annealing temperature of 750° C. Results of this survey are shown in FIG. 13. In FIG. 13, the axis of abscissas represents the annealing time at 750° C., and the axis of ordinates represents the sheet resistance. A $NiSi_x$ (x=1 through 2) layer to be measured in sheet resistance is formed by the above-mentioned method. In this case, a Ni film is set so as to be deposited to a thickness of 12 nm. As shown in FIG. 13, the sheet resistance is kept low in the range of annealing time from 10 to 20 seconds. However, when the annealing time exceeds approximately 20 seconds, the sheet resistance starts increasing to some extent. After the annealing time reaches 30 seconds, the sheet resistance further significantly increases.

The above-described experiment results were obtained on the flat top surface of the silicon substrate. It is considered that the similar tendency is observed for the silicide reaction at the top surfaces of source/drain regions of a substrate on which CMOS transistors are formed and the top surfaces of associated gate electrodes. In other words, a method in which the Ni film to be deposited is allowed to have a thickness of approximately 25 nm or more is considered as one of methods for providing a device having a high-heat-resistance nickel silicide (NiSi) layer. However, a NiSi layer resulting from silicidation of an approximately 25-nm-thick deposited Ni film has a thickness of approximately 50 nm, and the NiSi layer of such a thickness is not practical in formation of devices. Alternatively, in a case where an approximately 12-nm-thick deposited Ni film is used, an increase in the sheet resistance can be prevented by reducing the time during which heat treatment is conducted at a high temperature (hereinafter, referred to as "high-temperature heat treatment time") after silicide formation to approximately 10 seconds. However, under consideration of the actual heat treatment time for formation of an interconnect layer of a large-scale integrated circuit (LSI), the high-temperature heat treatment time cannot be reduced to approximately 10 seconds.

A method in which NiSi alloyed with Pt is formed using a Ni alloy containing Pt or any other alloy has been known as a method for providing a high-heat-resistance NiSi phase (see non-patent literature 5 and patent literature 1). The present inventors examined the relationship between the annealing temperature and the sheet resistance for a known method in which NiSi alloyed with Pt is provided by formation of a Pt film on the top surface of a Ni film deposited on a silicon (Si) substrate or at the interface between the Ni film and the Si substrate. As a result, as shown in FIG. 14, an increase in the sheet resistance was observed near an annealing temperature of 700° C., and expected enhancement of the heat resistance of NiSi was not observed.

To cope with this, the present inventors attempted to carry out the following method as a new method for forming a high-heat-resistance silicide (that is, the fabrication method for a semiconductor device according to the fourth embodiment of the present invention). More particularly, for example, an approximately 10- through 12-nm-thick Ni film is deposited on a silicon substrate by sputtering. Thereafter, the Ni film is subjected to heat treatment at a temperature of, for example, approximately 400 through 500° C. in a vacuum sputtering device, thereby forming a NiSi layer. Thereafter, an extremely thin Pt film is deposited on the NiSi layer without removing the silicon substrate from the sputtering device, and then the thin Pt film is again subjected to heat treatment. In this method, the thickness of the Ni film to be deposited is adjusted so that the total thickness of Pt to be deposited and Ni to be deposited is 12 nm. FIG. 14 illustrates the results obtained by the present inventors' survey of the relationship between the annealing temperature and sheet resistance of the Pt-containing NiSi layer so obtained. FIG. 14 illustrates the results obtained in accordance with various combinations of one of the thicknesses of Pt to be deposited and one of the thicknesses of Ni to be deposited, more specifically, a combination of a deposited Pt thickness of 0 nm and a deposited Ni thickness of 12 nm, a combination of a deposited Pt thickness of 1.2 nm and a deposited Ni thickness of 10.8 nm, a combination of a deposited Pt thickness of 0.6 nm and a deposited Ni thickness of 11.4 nm, a combination of a deposited Pt thickness of 0.54 nm and a deposited Pt thickness of 11.46 nm, a combination of a deposited Pt thickness of 0.32 nm and a deposited Ni thickness of 11.68 nm, and a combination of a deposited Pt thickness of 0.3 nm and a deposited Ni thickness of 11.7 nm.

Figure 14:
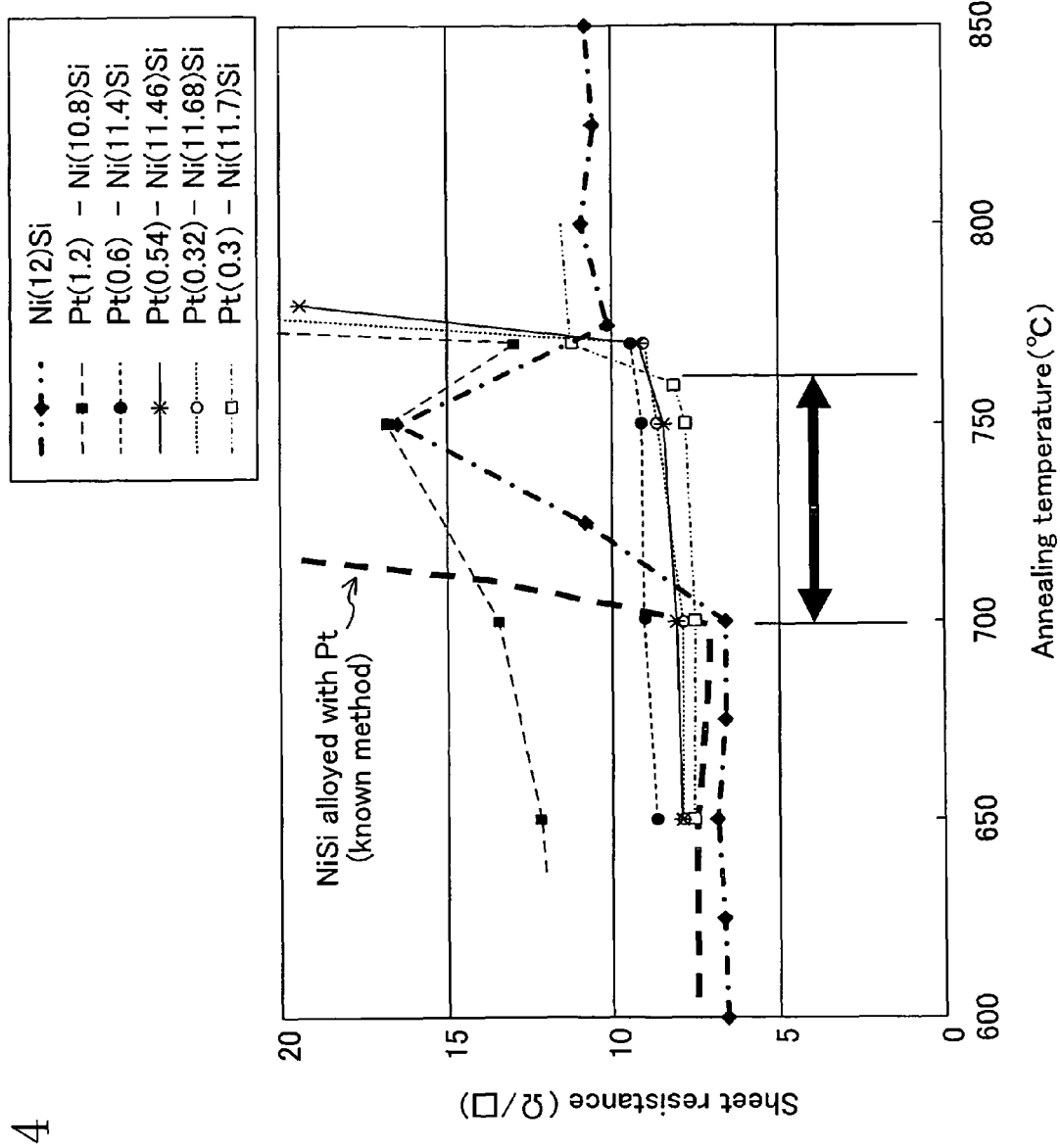
FIG. 14 is a graph illustrating results obtained by the present inventors' survey of the relationship between the annealing temperatures and sheet resistances of Pt-containing NiSi layers of the present invention.

As shown in FIG. 14, it has been found that in this embodiment, the temperature at which the phase of a NiSi layer is shifted from the NiSi phase to the $NiSi_2$ phase is increased by approximately 50° C. as compared with the known formation method for NiSi alloyed with Pt and the case where a NiSi layer is formed without depositing a Pt film. In particular, for the range of deposited Pt thicknesses of 0.6 nm and less, the peak of the sheet resistance corresponding to the phase shift near an annealing temperature of 750° C. disappears. Furthermore, for the range of the deposited Pt thicknesses of approximately 0.5 nm and less, the sheet resistance of the NiSi layer in the range of low temperatures of 750° C. and less is reduced by approximately 10% as compared with the case where the deposited Pt thickness is 0.6 nm. As seen from the above, it is desirable from the viewpoint of device applications that in this embodiment, the deposited Pt thickness is set at approximately 0.5 nm or less.

The above-mentioned effects of reducing the peak and enhancing the heat resistance of a NiSi layer are obtained by deposition of a Pt film having a thickness of 0.2 through 0.3 nm approximately equal to the thickness of one atomic layer. In other words, it is considered that the deposited thin Pt film acts as a layer for stabilizing the NiSi layer against the subsequent heat treatment. According to the present inventors' assumption, when a Pt film is deposited after the formation of a NiSi layer and then the Pt film is subjected to heat treatment, a Pt-containing NiSi layer is formed in the top surface of the NiSi layer, thereby stabilizing the NiSi layer. In this case, the platinum concentration in the whole NiSi layer including the Pt-containing layer becomes higher with increasing proximity to the top surface of the Pt-containing layer.

The above-mentioned effects of reducing the peak and enhancing the heat resistance of the NiSi layer can be obtained by not only a platinum film but also a film composed of any other element of the platinum group, such as a ruthenium film.

This embodiment will be described hereinafter in detail with reference to the following examples.

EXAMPLE 1

FIGS. 15A, 15B, 16A, 16B, 17A, 17B, and 18 are cross-sectional views illustrating process steps in a fabrication method for a semiconductor device according to a first example of the fourth embodiment.

In the first example, the process steps shown in FIGS. 1A through 1C, 2A through 2C, and 3A in the first embodiment are initially carried out. More particularly, as shown in FIG. 3A, the top surface of a high-heat-resistance region of a substrate is purified, and thereafter as shown in FIG. 15A, for example, a 10-nm-thick Ni film 401 is entirely deposited on a silicon substrate 100, for example, by sputtering. Before the formation of the Ni film 401, a low-heat-resistance region of the substrate 100 is covered with a first anti-silicidation protective film 110.

Next, the Ni film 401 is subjected to the first heat treatment in a vacuum sputtering device used in the process step shown in FIG. 15A, for example, at a temperature of approximately 400 through 500° C. In this way, silicon forming high concentration impurity diffusion layers 109A and gate electrodes 103A located on the high-heat-resistance region is caused to react with Ni in the Ni film 401. Thus, as shown in FIG. 15B, first nickel silicide layers 402 are formed on the high concentration impurity diffusion layers 109A and the gate electrodes 103A. As long as the entire surface of the Ni film 401 is kept clean, the process steps shown in FIGS. 15A and 15B do not need to be successively carried out in the same chamber.

Next, in the sputtering device, as shown in FIG. 16A, for example, an approximately 0.2- through 0.5-nm-thick thin Pt film 403 is deposited to entirely cover the silicon substrate 100 and the first nickel silicide layers 402. As long as the top surfaces of the first nickel silicide layers 402 are kept clean, the process steps shown in FIGS. 15B and 16A do not need to be successively carried out in the same chamber.

Next, the thin Pt film 403 is subjected to the second heat treatment in an inert atmosphere, for example, at a temperature of approximately 500 through 600° C. for approximately 30 through 60 seconds using, for example, a RTA device. The first nickel silicide layers 402 on the high-heat-resistance region are caused to react with the thin Pt film 403. In this way, as shown in FIG. 16B, layers 404 for stabilizing silicides (hereinafter, referred to as "silicide-stabilizing layers 404") made of a Pt-containing nickel silicide layer is formed in the top surfaces of the first nickel silicide layers 402. Thereafter, unreacted part of the metal on the high-heat-resistance region and parts of a layered film (composed of the Ni film 401 and the thin Pt film 403) located on the first anti-silicidation protective film 110 on the low-heat-resistance region are removed using, for example, a SPM solution. An alloy of Ni in the Ni film 401 and Pt in the thin Pt film 403, which has been produced in the second heat treatment, is removed by the SPM solution.

Figure 17A:
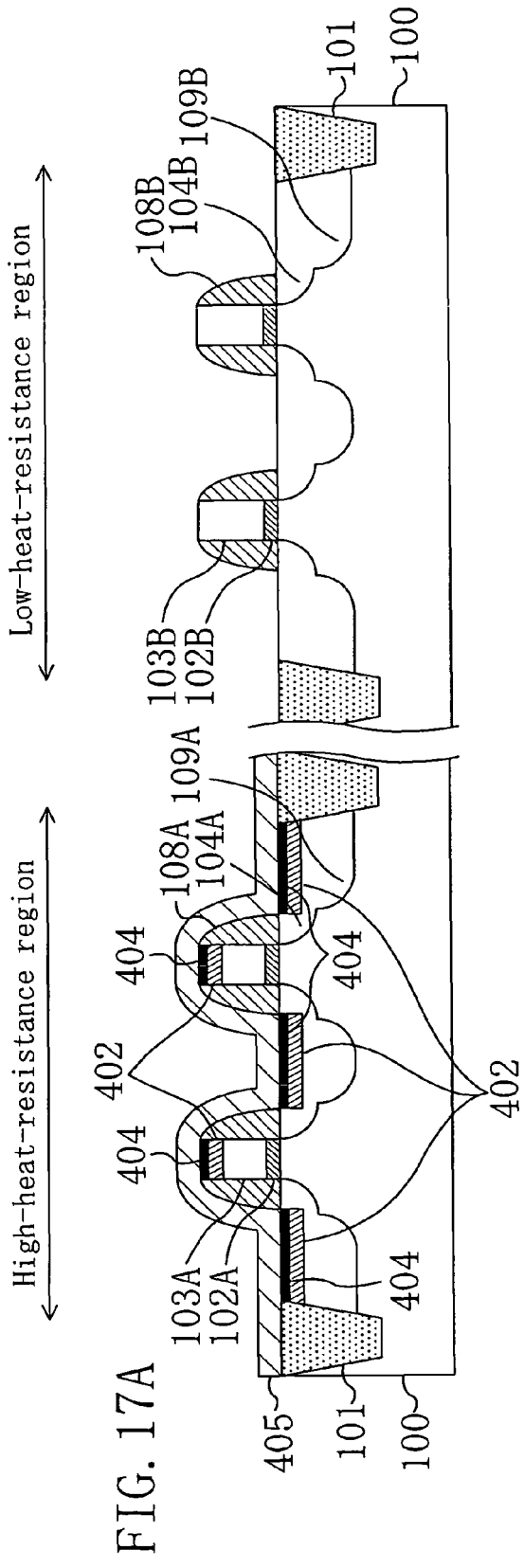
FIGS. 17A and 17B are cross-sectional views illustrating still other ones of the process steps in the fabrication method for a semiconductor device according to the first example of the fourth embodiment of the present invention.

Next, as shown in FIG. 17A, an anti-silicidation protective film 405 made of, for example, a silicon oxide film is selectively formed on the high-heat-resistance region, for example, by SA-CVD, photolithography and dry etching. Thereafter, the top surfaces of silicon regions to be caused to react with Ni are purified by removing native oxide films produced on silicon forming source/drain regions in the low-heat-resistance region of the substrate and polysilicon forming gate electrodes 103B on the low-heat-resistance region, for example, using DHF.

Figure 17B:
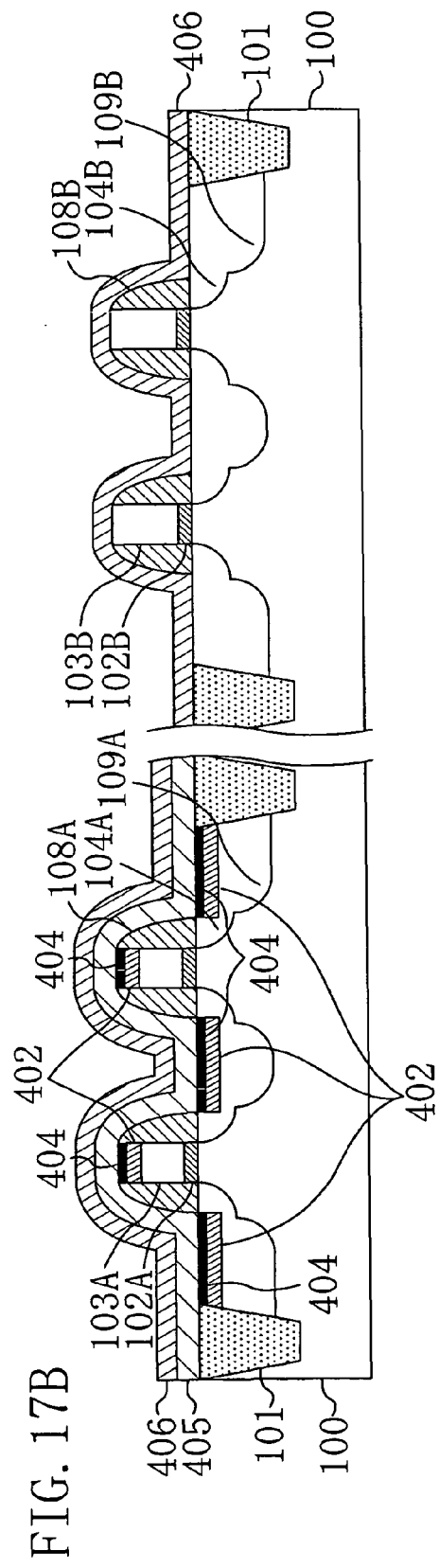

Next, as shown in FIG. 17B, for example, an approximately 10-nm-thick Ni film is entirely deposited on the silicon substrate 100, for example, by sputtering, and then, for example, an approximately 15-nm-thick TiN film for preventing oxidation is deposited to cover the Ni film, thereby forming a layered film 406 of the Ni film and the TiN film. The Ni film may be deposited by sputtering under conditions of, for example, a power density of approximately 2 W/cm$^2$, an Ar flow rate of approximately 10 ml/min (standard condition), and a pressure of approximately 1 mTorr (133 mPa). In addition, the TiN film may be deposited, for example, by reactive sputtering under conditions of a power density of approximately 4 W/cm$^2$, a nitrogen flow rate of approximately 100 ml/min (standard condition), an Ar flow rate of approximately 20 ml/min (standard condition), and a pressure of approximately 10 through 20 mTorr (1333 through 2666 mPa).

Figure 18:
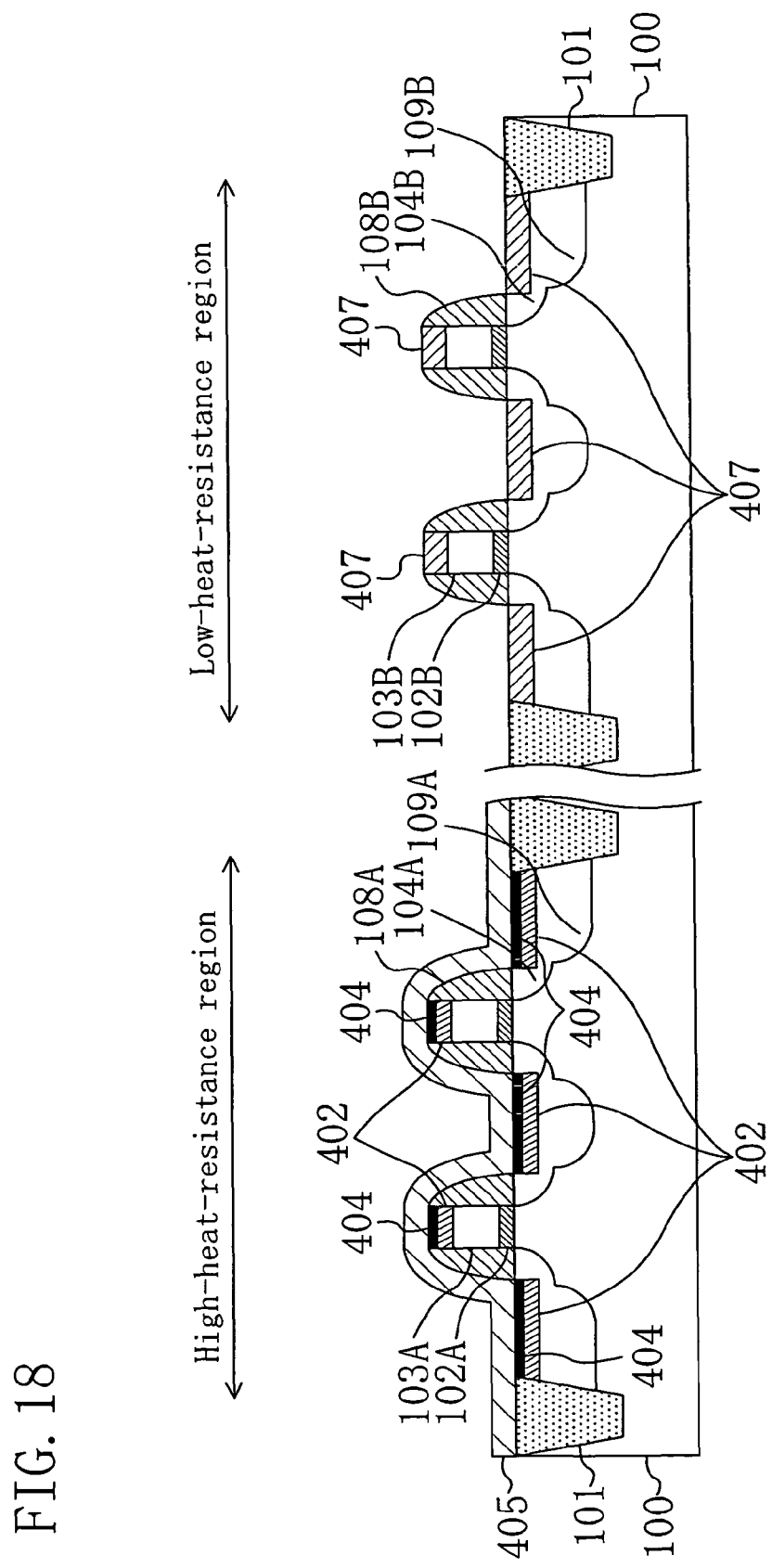
FIG. 18 is a cross-sectional view illustrating yet another one of the process steps in the fabrication method for a semiconductor device according to the first example of the fourth embodiment of the present invention.

Next, the layered film 406 is subjected to heat treatment using, for example, an RTA device, thereby causing silicon forming source/drain regions in the low-heat-resistance region and polysilicon forming the gate electrodes 103B on the low-heat-resistance region to react with Ni in the layered film 406. In this way, as shown in FIG. 18, second nickel silicide layers 407 are formed on the source/drain regions, i.e., high concentration impurity diffusion layers 109B, and the gate electrodes 103B. The above-mentioned heat treatment may be performed in two steps. To be specific, the layered film 406 is subjected to the first heat treatment in an inert atmosphere at a temperature of approximately 300° C. for approximately 30 seconds, for example, using a RTA device. Then, unreacted part of the layered film 406 is removed, for example, using a SPM solution. Thereafter, the part of the layered film 406 that has undergone a silicide reaction by the first heat treatment is subjected to the second heat treatment in an inert atmosphere at a temperature of approximately 550° C. for approximately 30 seconds, for example, using a RTA device. In this way, approximately 20-nm-thick nickel silicide layers 407 are formed.

According to the first example, since silicide-stabilizing layers 404 made of a Pt-containing nickel silicide layer is formed on the top surfaces of the first nickel silicide layers 402, this can increase the heat-resistant temperature of the first nickel silicide layers 402. More specifically, the heat resistance of Ni silicides can be simply enhanced, thereby providing a semiconductor device having high-heat-resistance Ni silicide regions with ease.

EXAMPLE 2

FIGS. 19A, 19B, 20A, 20B, and 21 are cross-sectional views illustrating process steps in a fabrication method for a semiconductor device according to a second example of the fourth embodiment.

Figure 19A:
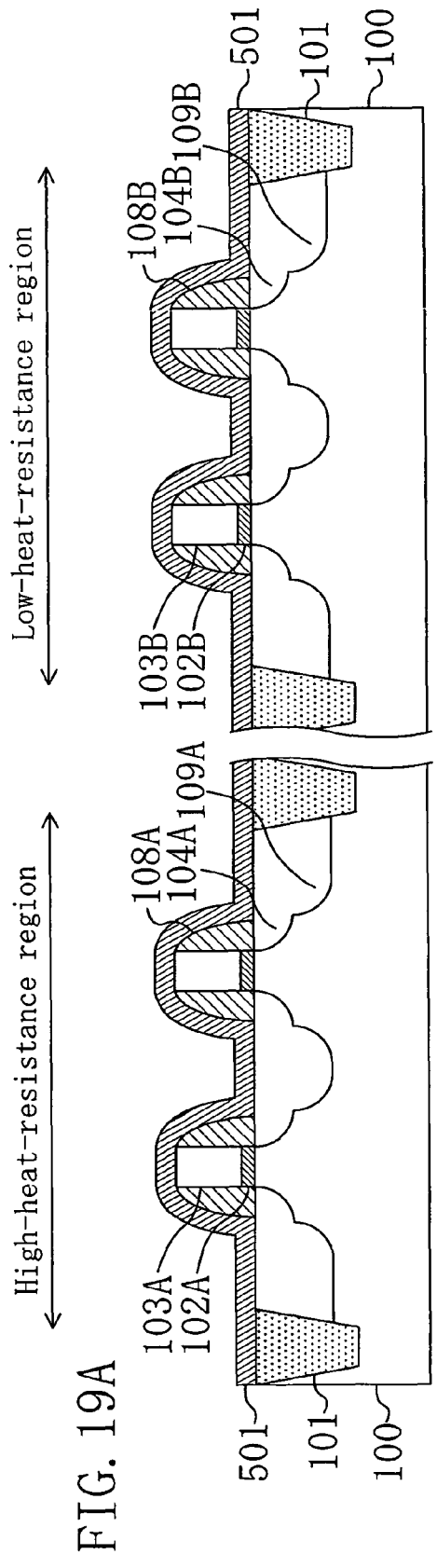
FIGS. 19A and 19B are cross-sectional views illustrating some of process steps in a fabrication method for a semiconductor device according to a second example of the fourth embodiment of the present invention.

In the second example, the process steps shown in FIGS. 1A through 1C and 2A in the first embodiment are initially carried out. More particularly, as shown in FIG. 2A, high concentration impurity diffusion layers 109A and 109B serving as source/drain regions are formed in the high-heat-resistance region and low-heat-resistance region of the silicon substrate 100, respectively, in a self aligned manner. Thereafter, as shown in FIG. 19A, for example, an approximately 10-nm-thick Ni film is entirely deposited on the silicon substrate 100, for example, by sputtering, and then, for example, an approximately 15-nm-thick TiN film for preventing oxidation is deposited on the Ni film, thereby forming a layered film 501 of the Ni film and the TiN film. The Ni film may be deposited by sputtering under conditions of, for example, a power density of approximately 2 W/cm$^2$, an Ar flow rate of approximately 10 ml/min (standard condition), and a pressure of approximately 1 mTorr (133 mPa). In addition, the TiN film may be deposited, for example, by reactive sputtering under conditions of a power density of approximately 4 W/cm$^2$, a nitrogen flow rate of approximately 100 ml/min (standard condition), an Ar flow rate of approximately 20 ml/min (standard condition), and a pressure of approximately 10 through 20 mTorr (1333 through 2666 mPa).

Figure 19B:
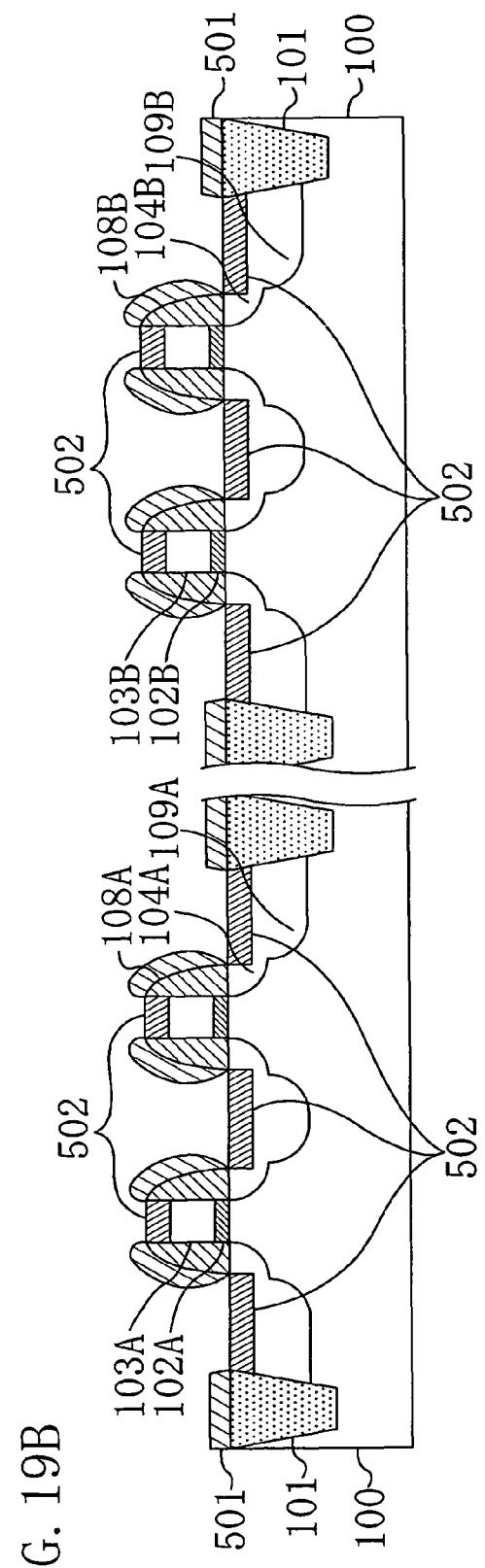

Next, the layered film 501 is subjected to heat treatment using, for example, an RTA device, thereby causing silicon forming source/drain regions in the high-heat-resistance region and the low-heat-resistance region of the substrate and polysilicon forming the gate electrodes 103A and 103B on the high-heat-resistance region and the low-heat-resistance region to react with Ni in the layered film 501. In this way, as shown in FIG. 19B, nickel silicide layers 502 are formed on high concentration impurity diffusion layers 109A and 109B and the gate electrodes 103A and 103B. The above-mentioned heat treatment may be performed in two steps. To be specific, the layered film 501 is subjected to the first heat treatment in an inert atmosphere at a temperature of approximately 300° C. for approximately 30 seconds, for example, using a RTA device. Then, unreacted part of the layered film 501 is removed, for example, using a SPM solution. Thereafter, the part of the layered film 501 that has undergone a silicide reaction by the first heat treatment is subjected to the second heat treatment in an inert atmosphere at a temperature of approximately 550° C. for approximately 30 seconds, for example, using a RTA device. In this way, approximately 20-nm-thick nickel silicide layers 502 are formed.

Next, as shown in FIG. 20A, a protective film 503 made of, for example, a silicon oxide film is selectively formed on the low-heat-resistance region, for example, by SA-CVD, photolithography and dry etching.

Next, as shown in FIG. 20B, an approximately 0.2- through 0.5-nm-thick thin Pt film 504 is entirely deposited on the silicon substrate 100, for example, by sputtering.

Figure 21:
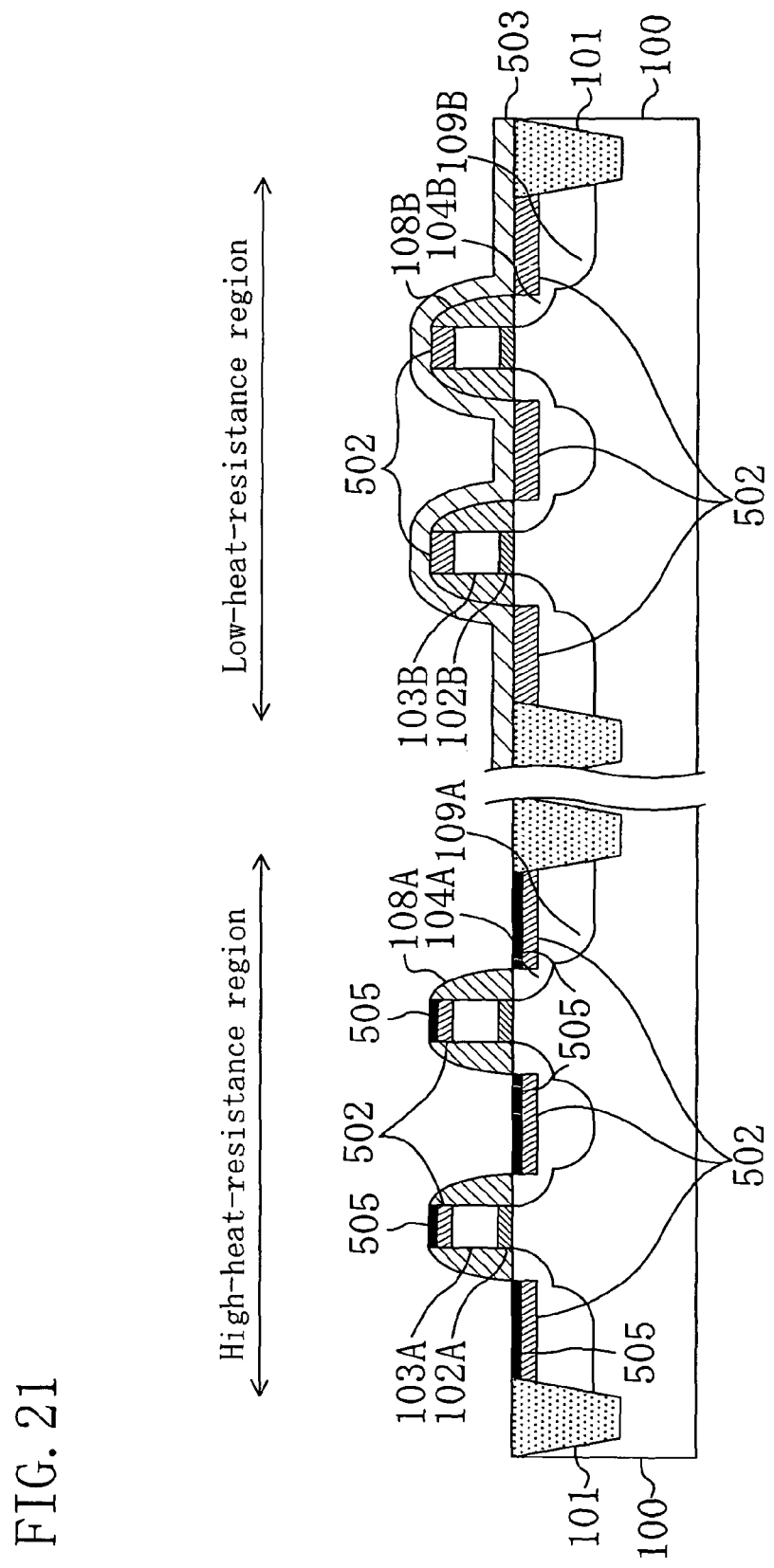
FIG. 21 is a cross-sectional view illustrating still another one of the process step in the fabrication method for a semiconductor device according to the second example of the fourth embodiment of the present invention.

Next, the thin Pt film 504 is subjected to heat treatment in an inert atmosphere, for example, at a temperature of approximately 500 through 600° C. for approximately 30 through 60 seconds using, for example, a RTA device. Thus, as shown in FIG. 21, ones of the nickel silicide layers 502 on the high-heat-resistance region are caused to react with the thin Pt film 504, thereby forming silicide-stabilizing layers 505 made of a Pt-containing nickel silicide layer in the top surfaces of the ones of the first nickel silicide layers 502 located on the high-heat-resistance region. Thereafter, unreacted part of the thin Pt film 504 on the high-heat-resistance region and part thereof on the protective film 503 covering the low-heat-resistance region are removed using, for example, a dilute aqueous mixture of nitric acid and hydrochloric acid.

According to the second example, since silicide-stabilizing layers 505 made of a Pt-containing nickel silicide layer are formed on the top surfaces of ones of the nickel silicide layers 502 located on the high-heat-resistance region, this can increase the heat-resistant temperature of the ones of nickel silicide layers 502 on the high-heat-resistance region. More specifically, the heat resistance of Ni silicides can be simply enhanced, thereby providing a semiconductor device having high-heat-resistance Ni silicide regions with ease.

According to the second example, ones of the nickel silicide layers 502 located on the high-heat-resistance region and the other ones thereof located on the low-heat-resistance region are formed in the same process step. Thereafter, while the ones of the nickel silicide layers 502 located on the low-heat-resistance region are covered with the protective film 503, the thin Pt film 504 is formed to cover the ones of the nickel silicide layers 502 located on the high-heat-resistance region. Then, the thin Pt film 504 is subjected to heat treatment, thereby forming silicide-stabilizing layers 505 on the ones of the nickel silicide layers 502 located on the high-heat-resistance region. In other words, although two photolithography processes and two dry etching processes have conventionally been needed to provide high-heat-resistance Ni silicide regions and low-heat-resistance Ni silicide regions, one photography process and one dry etching process both for allowing the ones of the nickel silicide layers 502 located on the low-heat-resistance region to be selectively covered with the protective film 503 can provide a desired device structure having a high-heat-resistance Ni silicide region and a low-heat-resistance Ni silicide region.

Although in the fourth embodiment silicide-stabilizing layers are formed in the top surfaces of ones of nickel silicide layers located on a high-heat-resistance region, they may be formed in the top surfaces of ones of nickel alloy silicide layers of the present invention (for example, first nickel alloy silicide layers 113 of the first embodiment) located on the high-heat-resistance region instead.

Although in the fourth embodiment some of nickel silicide layers are formed on a low-heat-resistance region, nickel alloy silicide layers of the present invention (for example, second nickel alloy silicide layers 117 of the first embodiment) may be alternatively formed thereon.

In the second or third embodiment, ones of nickel silicide layers of the fourth embodiment (formed with silicide-stabilizing layers) located on a high-heat-resistance region may be used as silicides for a CMOS portion of a semiconductor device. In addition, the other ones of the nickel silicide layers of the fourth embodiment (formed without silicide-stabilizing layers) located on a low-heat-resistance region may be used as silicides for an eFUSE portion of the semiconductor device.

What is claimed is:

1. A semiconductor device comprising a CMOS portion and an eFUSE portion both on a semiconductor substrate, wherein
   a first nickel alloy silicide layer is used for the CMOS portion,
   a second nickel alloy silicide layer is used for the eFUSE portion, the heat-resistant temperature of the first nickel alloy silicide layer is higher than that of the second nickel alloy silicide layer the heat-resistant temperature of the first nickel alloy silicide layer is greater than or equal to 600° C., and the heat-resistant temperature of the second nickel alloy silicide layer is less than or equal to 500° C.

2. The semiconductor device of claim 1 further comprising a gate electrode formed on the semiconductor substrate, wherein the eFUSE portion is formed in a fine-line portion of the gate electrode.

3. The semiconductor device of claim 1 further comprising a gate electrode formed on the semiconductor substrate, and a contact formed on the gate electrode so as to be connected to the gate electrode, wherein the eFUSE portion is formed in a portion of the gate electrode connected to the contact.

4. The semiconductor device of claim 1, wherein an alloyed metal contained in the first nickel alloy silicide layer is identical with an alloyed metal contained in the second nickel alloy silicide layer, and a nickel alloy forming the first nickel alloy silicide layer has a lower nickel content than a nickel alloy forming the second nickel alloy silicide layer.

5. The semiconductor device of claim 1, wherein a nickel alloy forming the first nickel alloy silicide layer has a nickel content of less than or equal to 30 at %, and a nickel alloy forming the second nickel alloy silicide layer has a nickel content of greater than or equal to 70 at %.

6. The semiconductor device of claim 1, wherein an alloyed metal contained in each of the first and second nickel alloy silicide layers is a metal capable of forming a silicide having a higher melting point than nickel silicide.

7. The semiconductor device of claim 1, wherein an alloyed metal contained in each of the first and second nickel alloy silicide layers is vanadium (V), molybdenum (Mo), cobalt (Co), niobium (Nb), tantalum (Ta), tungsten (W), zirconium (Zr), manganese (Mn), iron (Fe), iridium (Ir), ruthenium (Ru), rhodium (Rh), or hafnium (Hf).

8. The semiconductor device of claim 1, wherein the first and second nickel alloy silicide layers are each formed by siliciding a multilayer structure including a nickel alloy film and a nickel film, and the nickel film contained in the multilayer structure forming the first nickel alloy silicide layer is thinner than the nickel film contained in the multilayer structure forming the second nickel alloy silicide layer.

9. The semiconductor device of claim 1, wherein the first and second nickel alloy silicide layers contain different alloyed metals, and a melting point of the alloyed metal contained in the first nickel alloy silicide layer is higher than a melting point of the alloyed metal contained in the second nickel alloy silicide layer.

* * * * *